(12) United States Patent
Kuribara et al.

(10) Patent No.: US 11,581,046 B2
(45) Date of Patent: Feb. 14, 2023

(54) STORAGE DEVICE AND READING METHOD

(71) Applicant: Kioxia Corporation, Tokyo (JP)

(72) Inventors: Makoto Kuribara, Yokohama (JP); Shin Takasaka, Hiratsuka (JP); Rintaro Arai, Yokohama (JP)

(73) Assignee: Kioxia Corporation, Tokyo (JP)

( * ) Notice: Subject to any disclaimer, the term of this patent is extended or adjusted under 35 U.S.C. 154(b) by 46 days.

(21) Appl. No.: 17/201,462

(22) Filed: Mar. 15, 2021

(65) Prior Publication Data

US 2022/0093182 A1 Mar. 24, 2022

(30) Foreign Application Priority Data

Sep. 18, 2020 (JP) .............................. JP2020-157518

(51) Int. Cl.
*G11C 16/26* (2006.01)
*G11C 16/04* (2006.01)
*G11C 16/10* (2006.01)
*G11C 11/56* (2006.01)
*G06F 11/10* (2006.01)
*G06F 3/06* (2006.01)

(52) U.S. Cl.
CPC ............ *G11C 16/26* (2013.01); *G06F 3/0619* (2013.01); *G06F 3/0659* (2013.01); *G06F 3/0679* (2013.01); *G06F 11/1068* (2013.01); *G11C 11/5628* (2013.01); *G11C 11/5642* (2013.01); *G11C 16/0483* (2013.01); *G11C 16/10* (2013.01)

(58) Field of Classification Search
CPC . G11C 16/26; G11C 11/5628; G11C 11/5642; G11C 16/0483; G06F 3/0619; G06F 3/0659; G06F 3/0679; G06F 11/1068
See application file for complete search history.

(56) References Cited

U.S. PATENT DOCUMENTS

| | | | |
|---|---|---|---|
| 9,009,390 B2 | 4/2015 | Choi et al. | |
| 9,367,391 B2 | 6/2016 | Lam | |
| 9,576,671 B2 | 2/2017 | Karakulak et al. | |
| 10,424,383 B1* | 9/2019 | Hsiao | G06F 3/0659 |
| 11,152,073 B1* | 10/2021 | Fitzpatrick | G11C 16/26 |
| 2014/0173172 A1* | 6/2014 | Yang | G06F 12/0246 |
| | | | 711/102 |
| 2021/0271415 A1* | 9/2021 | Fitzpatrick | G11C 16/26 |

* cited by examiner

*Primary Examiner* — Kyle Vallecillo
(74) *Attorney, Agent, or Firm* — Oblon, McClelland, Maier & Neustadt, L.L.P.

(57) ABSTRACT

According to one embodiment, a storage device includes a nonvolatile memory and a controller. The controller is configured to read data from the nonvolatile memory by applying a read voltage to the nonvolatile memory. The controller is configured to correct the read voltage based on a difference between a measured value of a bit number obtained when the data is read from the nonvolatile memory by applying the read voltage to the nonvolatile memory and an expected value of the bit number.

18 Claims, 25 Drawing Sheets

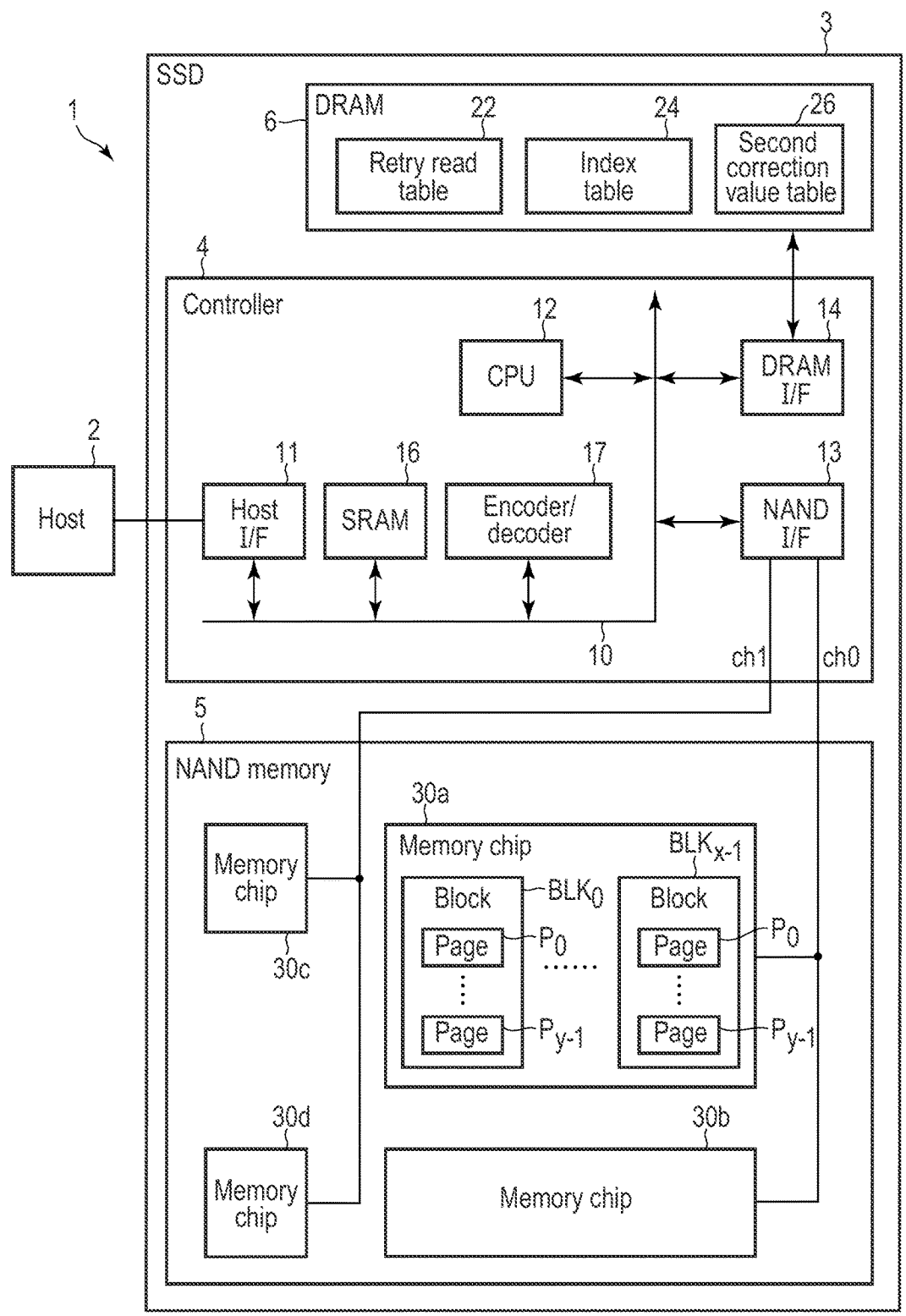
F I G. 1

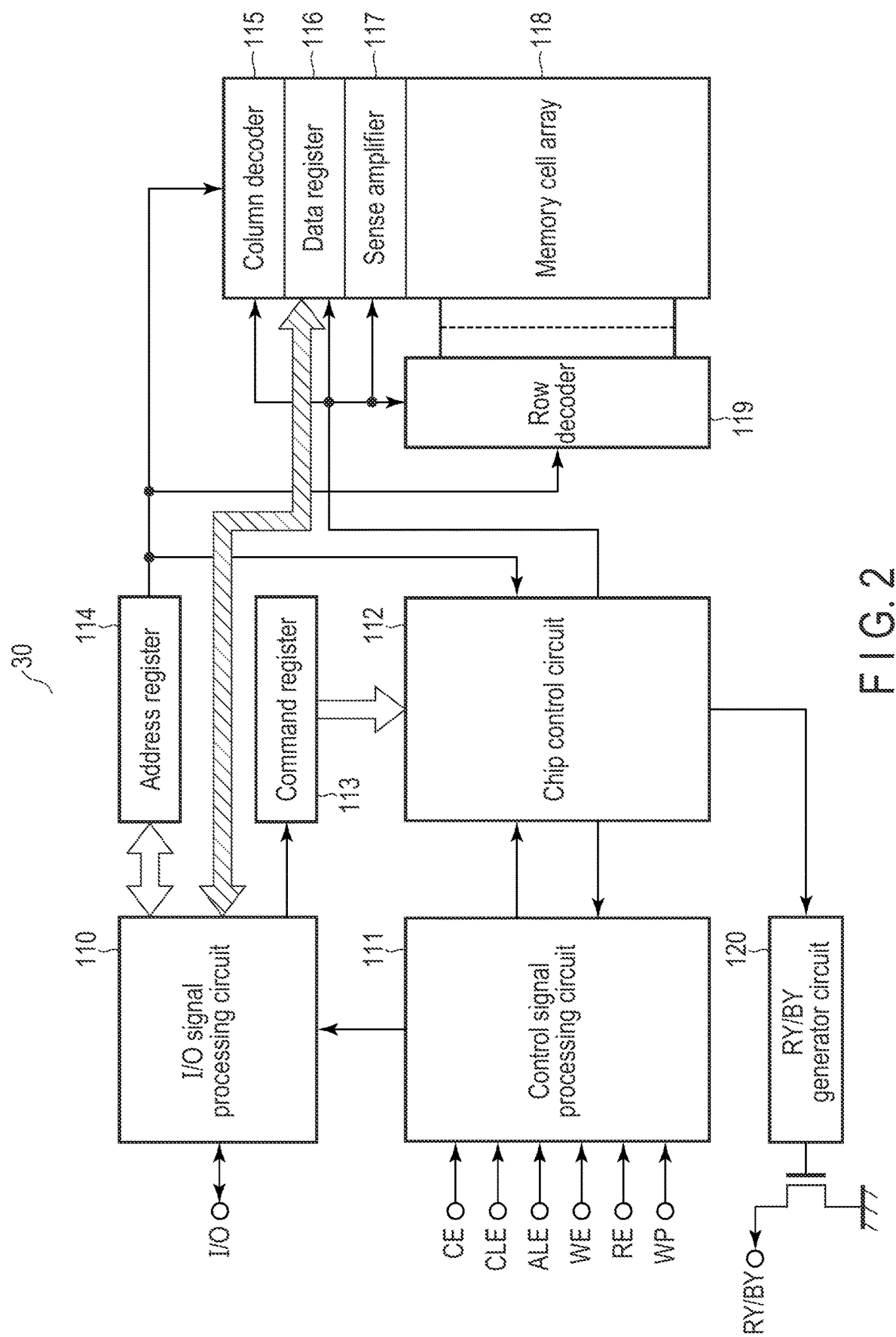
F I G. 2

Retry read table 22

| Read voltage | First correction value (dac) | | | | | | |
|---|---|---|---|---|---|---|---|
| | Index | | | | | | |
| | #0 | #1 | #2 | #3 | #4 | .... | #63 |
| VA | 0 | −2 | −4 | 2 | −4 | .... | −16 |
| VB | 0 | 2 | 4 | 2 | 2 | .... | −8 |
| VC | 0 | 4 | 6 | −2 | 6 | .... | −8 |
| VD | 0 | 4 | 8 | 8 | 8 | .... | −6 |
| VE | 0 | 2 | −2 | 8 | 8 | .... | −10 |
| VF | 0 | 6 | 10 | 10 | 10 | .... | −10 |
| VG | 0 | −2 | 4 | 12 | 12 | .... | −14 |

FIG. 5

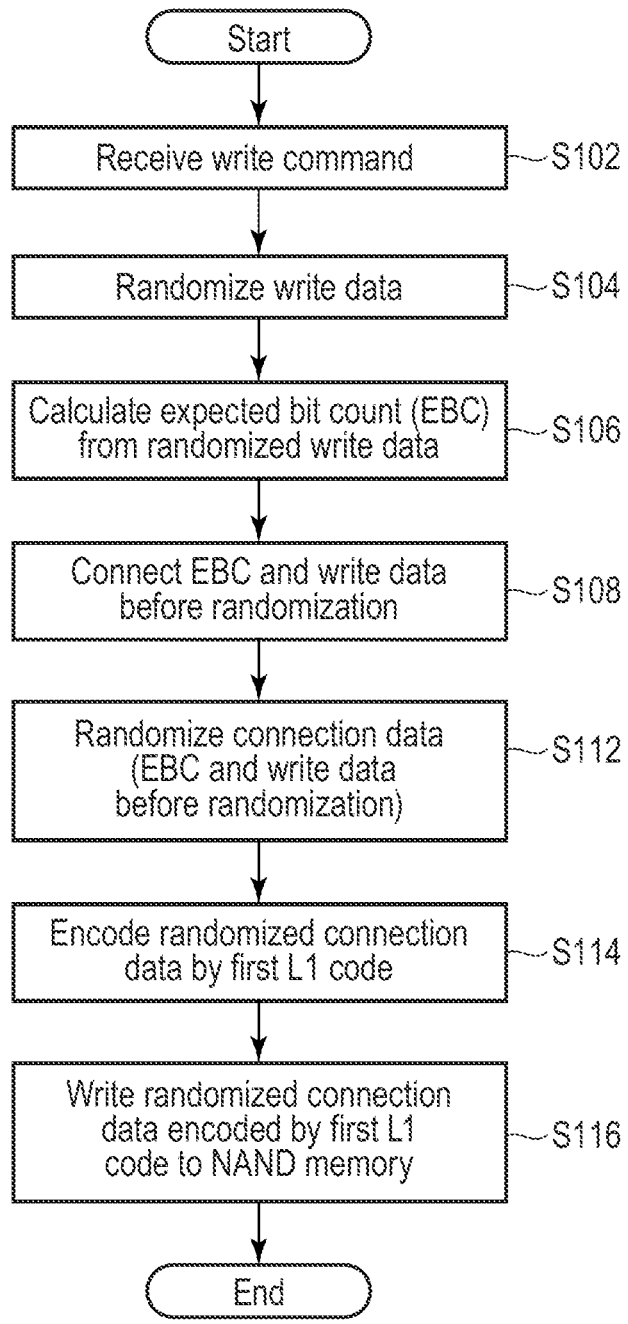
F I G. 6

|  | ER | A | B | C |
|---|---|---|---|---|
| L (Lower) (EBC$_B$) | 1 | 1 | 0 | 0 |
| U (Upper) | 1 | 0 | 0 | 1 |
| L&U (EBC$_A$) | 1 | 0 | 0 | 0 |
| L\|~U (EBC$_C$) | 1 | 1 | 1 | 0 |

FIG. 7

|  | ER | A | B | C | D | E | F | G |
|---|---|---|---|---|---|---|---|---|
| L (Lower) | 1 | 0 | 0 | 0 | 0 | 1 | 1 | 1 |
| M (Middle) | 1 | 1 | 0 | 0 | 1 | 1 | 0 | 0 |
| U (Upper) | 1 | 1 | 1 | 0 | 0 | 0 | 0 | 1 |
| L&M&U (EBC$_A$) | 1 | 0 | 0 | 0 | 0 | 0 | 0 | 0 |
| M&U (EBC$_B$) | 1 | 1 | 0 | 0 | 0 | 0 | 0 | 0 |
| ~L&U\|M&U (EBC$_C$) | 1 | 1 | 1 | 0 | 0 | 0 | 0 | 0 |
| ~L&~M\|M&U (EBC$_D$) | 1 | 1 | 1 | 1 | 0 | 0 | 0 | 0 |
| M&U\|~L (EBC$_E$) | 1 | 1 | 1 | 1 | 1 | 0 | 0 | 0 |
| ~L\|M (EBC$_F$) | 1 | 1 | 1 | 1 | 1 | 1 | 0 | 0 |
| ~L\|~U\|M (EBC$_G$) | 1 | 1 | 1 | 1 | 1 | 1 | 1 | 0 |

FIG. 8

| Page |||||||||
|---|---|---|---|---|---|---|---|---|
| Data | P | Data | P | ....... | Data | P | Unused part |

FIG. 9A

| Memory chip |||||
|---|---|---|---|---|
| Block | Block | ....... | Block | Spare column |

FIG. 9B

Index table 24

| Physical address | Index at time of calculating second correction value | Current index |
|---|---|---|
| A | #2 | #2 |
| B | #1 | #2 |
| C | #3 | #3 |
| .... | .... | .... |
| X | #3 | #3 |
| Y | #6 | #6 |
| Z | #2 | #3 |

FIG. 12

Second correction value table 26

| Physical address | Read voltage | Second correction value |
|---|---|---|
| PB1 | VA | C1a |
|  | VB | C1b |
|  | VC | C1c |
|  | VD | C1d |
|  | VE | C1e |
|  | VF | C1f |
|  | VG | C1g |
| PB2 | VA | C2a |
|  | VB | C2b |
|  | VC | C2c |
|  | VD | C2d |
|  | VE | C2e |
|  | VF | C2f |
|  | VG | C2g |
| .... | .... | .... |

FIG. 13

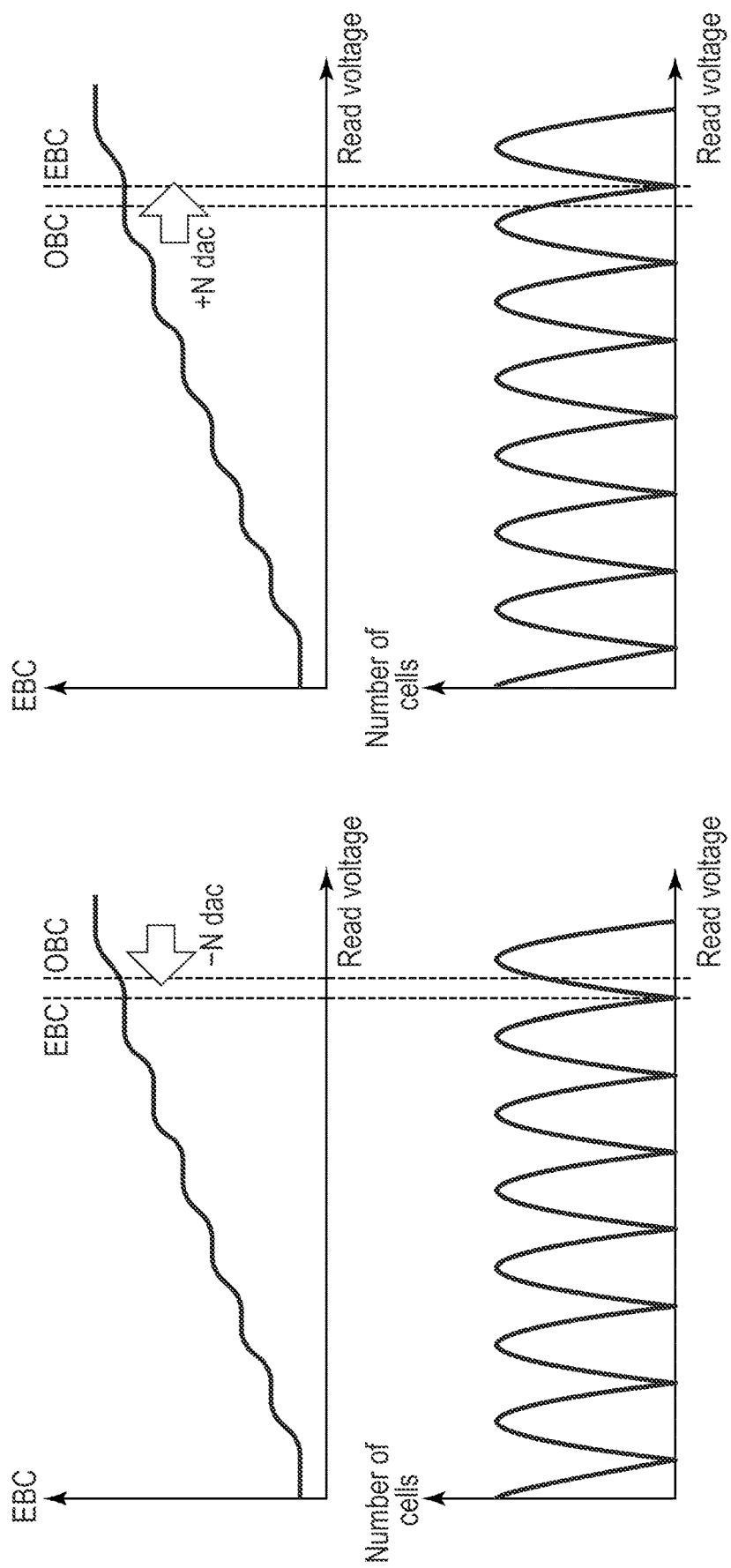
F I G. 15A  F I G. 15B

Second correction value table 26a

| Physical address | EBC-OBC | Second correction value (dac) | | |
|---|---|---|---|---|
| | | Read voltage VA | ... | Read voltage VG |
| PB1 | +100 not less than | +10 | ... | +14 |
| | +80~+99 | +8 | ... | +8 |
| | +50~+79 | +5 | ... | +4 |
| | -49~+49 | 0 (no correction) | ... | 0 (no correction) |
| | -50~-59 | -3 | ... | -3 |
| | -60~-79 | -6 | ... | -6 |
| | -80~-110 | -11 | ... | -10 |
| | -110 less than | -15 | ... | -15 |
| PB2 | +100 not less than | +10 | ... | +10 |
| | +80~+99 | +8 | ... | +8 |
| | +50~+79 | +5 | ... | +5 |
| | +29~+49 | +3 | ... | +3 |
| | -28~+28 | 0 (no correction) | ... | 0 (no correction) |
| | -29~-50 | -1 | ... | -2 |
| | -50~-59 | -3 | ... | -3 |
| | -60~-79 | -6 | ... | -6 |
| | -80~-110 | -11 | ... | -10 |
| | -110 less than | -15 | ... | -14 |
| ... | ... | ... | ... | ... |

F I G. 16

Second correction value table 26b

| Read voltage | EBC | OBC | Second correction value (dac) |
|---|---|---|---|
| VA | 4000 | 4009 | 4 |
| VB | 8000 | - | 12 (estimated value) |
| VC | 12000 | - | 20 (estimated value) |
| VD | 16000 | - | 28 (estimated value) |
| VE | 20000 | - | 36 (estimated value) |
| VF | 24000 | - | 42 (estimated value) |
| VG | 28000 | 28064 | 50 |

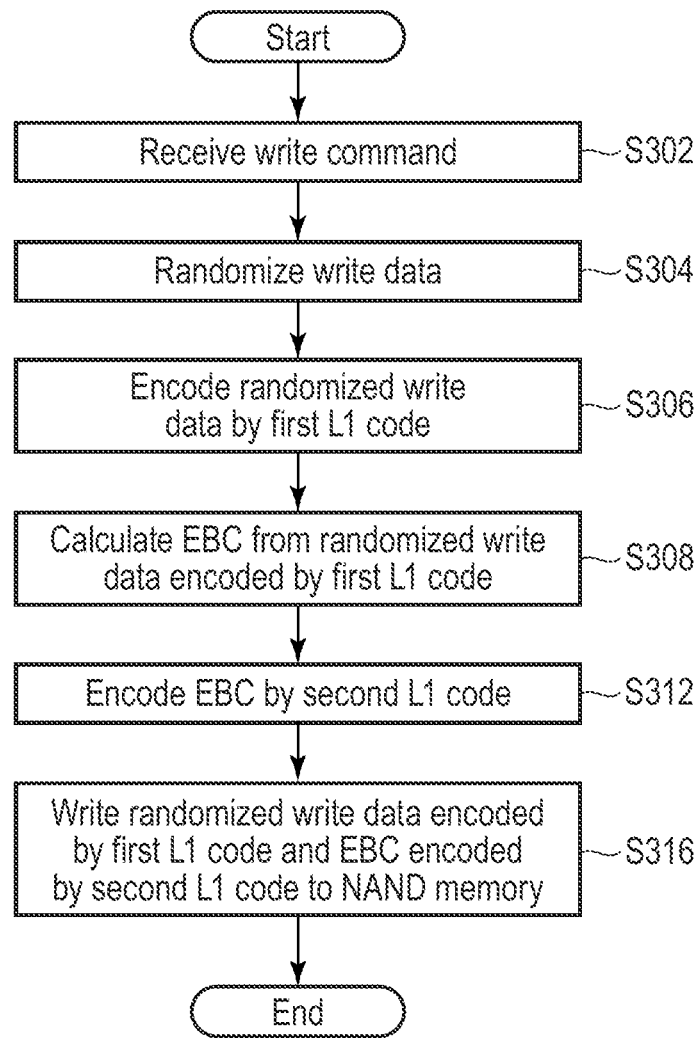
F I G. 19

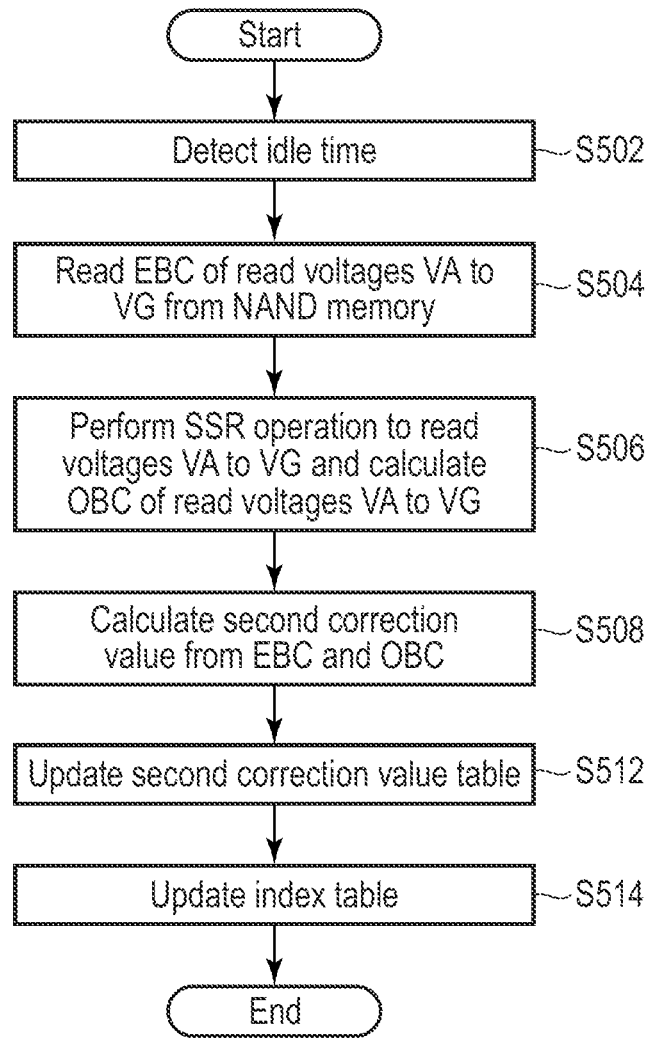
F I G. 23

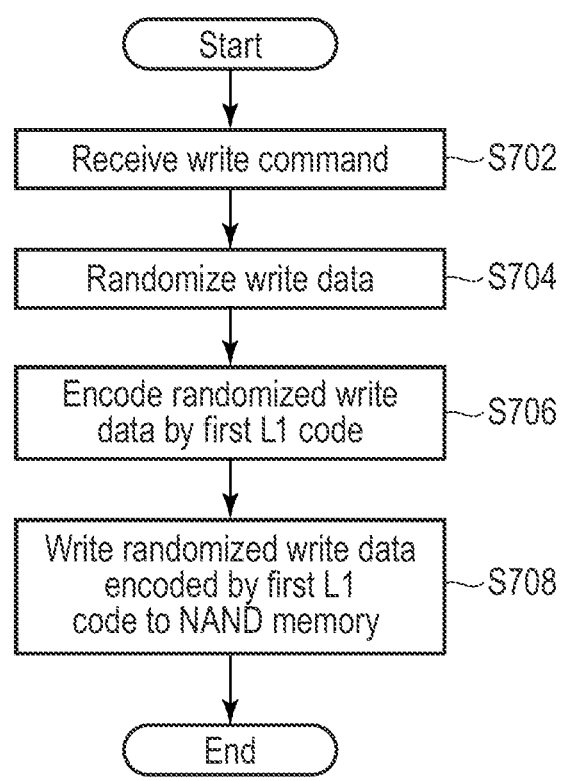
F I G. 26

STORAGE DEVICE AND READING METHOD

CROSS-REFERENCE TO RELATED APPLICATIONS

This application is based upon and claims the benefit of priority from Japanese Patent Application No. 2020-157518, filed Sep. 18, 2020, the entire contents of which are incorporated herein by reference.

FIELD

Embodiments described herein relate generally to a storage device including a nonvolatile memory and a reading method.

BACKGROUND

As an example of storage devices including a nonvolatile memory, there is a solid state drive (SSD). A suitable read voltage of a nonvolatile memory changes based on a variation of a threshold voltage distribution of memory cells. Data read from the nonvolatile memory using an unsuitable read voltage may include an error. The storage device corrects an error if the error is detected in the data read from the nonvolatile memory. The storage device may repeat retry read operations while changing the read voltage until the error correction of the read data succeeds. When the number of the retry read operations increases, a response to a read command is delayed.

BRIEF DESCRIPTION OF THE DRAWINGS

FIG. 1 is an example of a memory system including a storage device of a first embodiment.

FIG. 2 is an example of a memory chip in the storage device of the first embodiment.

FIG. 5 is an example of a retry read table.

FIG. 6 is a flowchart of an example of a write operation of the first embodiment.

FIG. 7 illustrates how to calculate an EBC in an MLC memory cell.

FIG. 8 illustrates how to calculate the EBC in the TLC memory cell.

FIGS. 9A and 9B illustrate examples of a write destination of the EBC in a NAND memory.

FIG. 12 is an example of an index table.

FIG. 13 is an example of a second correction value table.

FIGS. 15A and 15B illustrate examples of how to acquire a second correction value of the first embodiment.

FIG. 16 illustrates another example of how to acquire the second correction value of the first embodiment.

FIG. 19 is a flowchart of an example of a write operation of a second embodiment.

FIG. 23 is a flowchart of an example of a write operation of a third embodiment.

FIG. 26 is a flowchart of an example of a write operation of a fourth embodiment.

DETAILED DESCRIPTION

Figure 3:
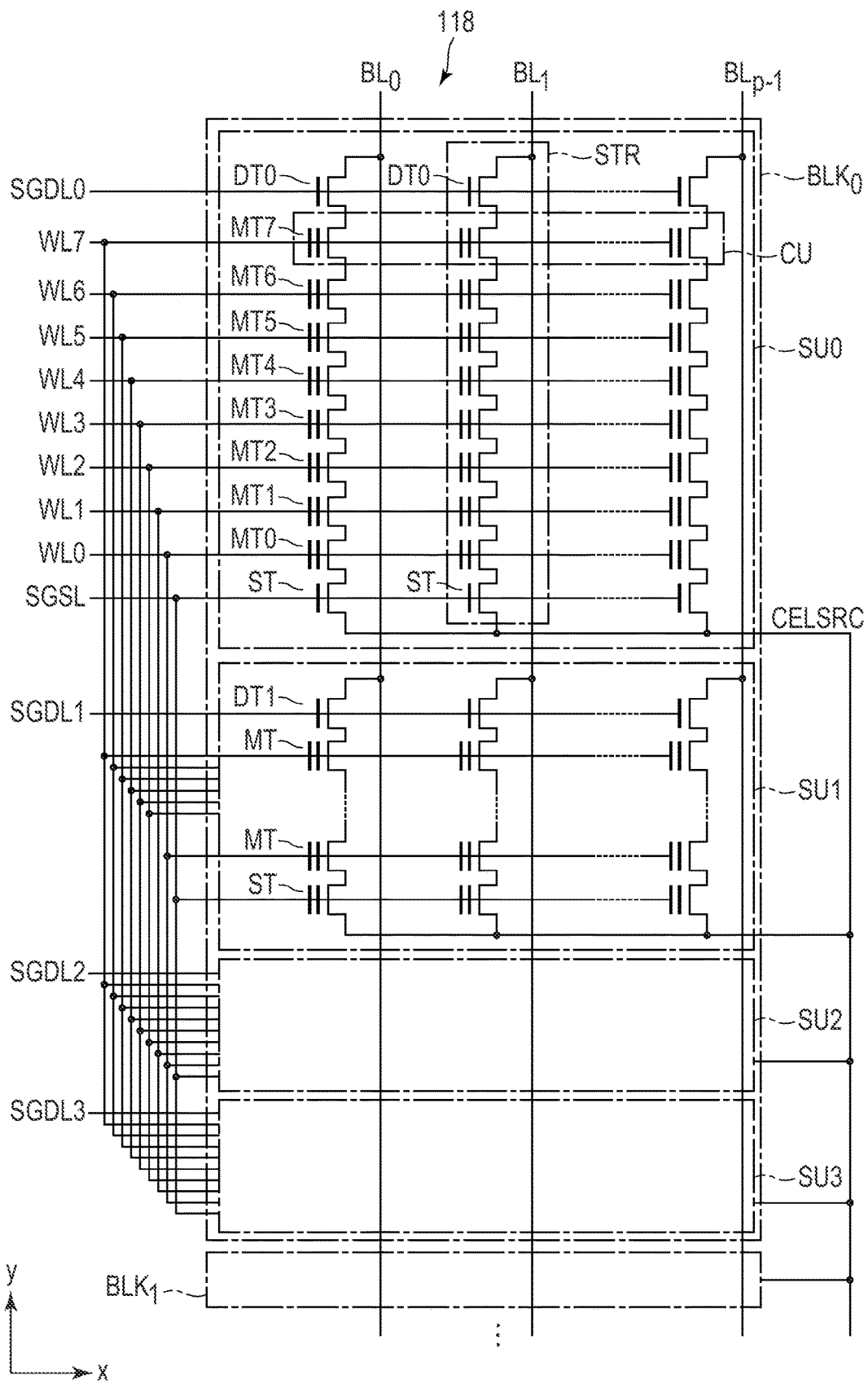
FIG. 3 is an example of a memory cell array in the storage device of the first embodiment.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes, and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a storage device includes a nonvolatile memory and a controller. The controller is configured to read data from the nonvolatile memory by applying a read voltage to the nonvolatile memory. The controller is configured to correct the read voltage based on a difference between a measured value of a bit number obtained when the data is read from the nonvolatile memory by applying the read voltage to the nonvolatile memory and an expected value of the bit number. The expected value is a value expected to be obtained when the data is read from the nonvolatile memory by applying the read voltage to the nonvolatile memory

FIRST EMBODIMENT (System Structure)

FIG. 1 illustrates an example of a memory system 1 including a storage device of a first embodiment. The memory system 1 includes a host 2 and a storage device 3. An example of the storage device 3 is an SSD. Hereinafter, the storage device 3 is referred to as the SSD 3. The SSD 3 is a semiconductor storage device configured to write data in a nonvolatile memory and to read data from the nonvolatile memory. The storage device may be a universal flash storage (UFS) device.

The host 2 is an information processing device configured to control the SSD 3. The host 2 is, for example, a personal computer, server computer, mobile terminal, or in-car device.

The SSD 3 may be connected to the host 2 via a wired or wireless manner, or may be installed in the host 2.

An interface to connect the host 2 and the SSD 3 may be but not limited to, for example, serial ATA (SATA), serial attached SCSI (SAS), UFS, PCI express (PCIe)™, or Ethernet™.

The SSD 3 includes a controller 4, and a nonvolatile memory 5. An example of the nonvolatile memory 5 is a NAND flash memory. Hereinafter, the nonvolatile memory 5 is referred to as the NAND memory 5.

The NAND memory 5 may be a two dimensional NAND memory, or may be a three dimensional NAND memory. The NAND memory 5 includes multiple memory chips, for example, four memory chips 30a, 30b, 30c, and 30d (if there is no need to distinguish, may be referred to as memory chips 30). Each of the memory chips 30 includes a memory cell array including a plurality of memory cells arranged in a matrix.

The SSD 3 may include a dynamic random access memory such as a DRAM 6. The DRAM 6 functions as a buffer for data transfer between the host 2 and the NAND memory 5. A part of a storage area of the DRAM 6 may be used as a write buffer, a read buffer, and a command buffer. The write buffer temporarily stores data to be written to the NAND memory 5. The read buffer temporarily stores data read from the NAND memory 5. The command buffer temporarily stores a command received from the host 2 until the command is executed.

The controller 4 may be realized as a circuit of system on a chip (SoC), for example. The controller 4 is electrically connected to the NAND memory 5 via a NAND interface (NAND I/F) 13 conforming to, for example, a toggle NAND flash interface or an open NAND flash interface (ONFI). The NAND I/F 13 is an interface circuit configured to control the NAND memory 5 under control of a CPU 12. The NAND I/F 13 may be referred to as NAND controller.

The NAND I/F 13 includes two channels Ch0 and Ch1. The number of channels is not limited to two, and may be one or may be three or more. Multiple memory chips, for example, two memory chips 30a and 30b are connected to the channel Ch0. Multiple memory chips, for example, two memory chips 30c and 30d are connected to the channel Ch1.

Each of the channels Ch0 and Ch1 includes a control signal line, an I/O signal line, a chip enable (CE) signal line, and a ready/busy (RY/BY) signal line. The I/O signal line is a signal line to transfer data, address, and various commands. The NAND I/F 13 can transmit a read command, a write command, and an erase command to each of the memory chips 30 via the I/O signal line. The control signal line includes, for example, a write enable (WE) signal line, a read enable (RE) signal line, a command latch enable (CLE) signal line, an address latch enable (ALE) signal line, and a write protect (WP) signal line.

Each memory cell array of each of the memory chips 30 includes a plurality of blocks BLK0 to BLKx−1 (if there is no need to distinguish, may be referred to as blocks BLK). Each of the blocks BLK includes a plurality of pages P0 to Py (if there is no need to distinguish, may be referred to as pages P). Each of the pages P includes a plurality of memory cells connected to the same word line. Each of the blocks BLK is a unit of data erase operation to erase data from the NAND memory 5 (may be referred to as block erase). Each of the blocks BLK may be referred to as an erase block, a physical block, or a physical erase block. The page P is a unit of data write operation and data read operation.

The controller 4 may function as a flash translation layer (FTL) configured to execute data management and block management of the NAND memory 5.

The data management executed by the FTL includes (1) management of mapping information indicative of a relationship between a logical address and a physical address of the NAND memory 5, and (2) a management of covering restriction of the NAND memory 5 (for example, read/write operation of page unit and erase operation of block unit).

The logical address is an address used by the host 2 for address designation of a storage position in a logical address space of the SSD 3. An example of the logical address is a logical block address (LBA).

The mapping management between the logical address to access the SSD 3 used by the host 2 and the physical address of the NAND memory 5 is executed using a logical physical address conversion table (hereinafter referred to as a logical to physical conversion table). The logical to physical conversion table is stored in a management data area in the NAND memory 5, and is transmitted from the NAND memory 5 to the DRAM 6 at a suitable timing which is, for example, turning on of the SSD 3, to be stored in the DRAM 6. Data in the NAND memory 5, such as the logical to physical address table, is not necessary to be transmitted to the DRAM 6.

The controller 4 accesses the NAND memory 5 using the logical to physical conversion table stored in the DRAM 6. The logical to physical conversion table includes a plurality of entries corresponding to a plurality of logical addresses, respectively. In an entry corresponding to a logical address, a physical address associated with the logical address is stored. For example, if the controller 4 writes data corresponding to a certain logical address to a certain physical storage position in the NAND memory 5, the controller 4 updates the logical to physical conversion table to associate the physical address indicative of the storage position with the logical address. The controller 4 writes the updated logical to physical conversion table to the management data area in the NAND memory 5 at a suitable timing until the power is turned off, and the logical to physical conversion table is stored in a nonvolatile manner.

The DRAM 6 further stores a retry read table (first correction value table) 22, an index table 24, and a second correction value table 26. The retry read table 22 will be described later with reference to FIG. 5. The index table 24 will be described later with reference to FIG. 12. The second correction value table 26 will be described later with reference to FIG. 13. As with the logical to physical conversion table, the retry read table 22, the index table 24, and the second correction value table 26 are stored in the management data area in the NAND memory 5, and they are transmitted to the DRAM 6 from the management data area in the NAND memory 5 at a suitable timing which is, for example, turning on of the SSD 3, to be stored in the DRAM 6.

As with the logical to physical conversion table, the controller 4 updates the retry read table 22, the index table 24, and the second correction value table 26. As with the logical to physical conversion table, the controller 4 writes the updated retry read table 22, the index table 24, and the second correction value table 26 to the management data area in the NAND memory 5 at a suitable time until the power of SSD 3 is turned off, and the retry read table 22, the index table 24, and the second correction value table 26 is stored in a nonvolatile manner.

The controller 4 includes, in addition to the aforementioned NAND I/F 13, a host interface (host I/F) 11, the CPU 12, a DRAM interface (DRAM I/F) 14, a static RAM (SRAM) 16, and an encoder/decoder 17. The host I/F 11, the CPU 12, the NAND I/F 13, the DRAM I/F 14, the SRAM 16, and the encoder/decoder 17 are mutually connected via a bus 10. Note that the controller 4 may be one integrated circuit to which these components are incorporated. Furthermore, a part of the components may be disposed outside the controller 4.

The host I/F 11 is an interface circuit configured to execute communication with the host 2. The host I/F 11 may be, for example, a SATA interface controller, a SAS interface controller, a PCIe controller, or an Ethernet controller. The host I/F 11 receives various commands such as a write command and a read command from the host 2. The write command includes a logical address (start logical address) and a size of write data. The host 2 transmits write data after a write command. The write command requests the SSD 3 to write the write data in a storage area of the NAND memory 5 corresponding to the start logical address and the size. The read command includes a logical address (start logical address) and a size of data to be read. The read command requests the SSD 3 to read data from a storage area of the NAND memory 5 corresponding to the start logical address and the size.

The DRAM I/F 14 is an interface circuit configured to control the DRAM 6 under control of the CPU 12. The DRAM I/F 14 may be referred to as DRAM controller.

The encoder/decoder 17 is a circuit to execute an encode operation and a decode operation of data for error detection and error correction in the read data. The encoder/decoder 17 encodes data to be written to the NAND memory 5 (write data). The encoder/decoder 17 decodes data read from the NAND memory 5 (read data). In the decoding, the encoder/decoder 17 executes the error detection and the error correction in the read data. The encoder/decoder 17 transmits, if the error correction does not succeed, a signal indicative of a failure of error correction to the CPU 12. The encode/decode 17 can be executed by an optional algorithm using, for example, Reed-Solomon coding, Bose-Chaudhuri-Hocquenghem (BCH) coding, or Low Density Parity Check (LDPC) coding.

In the write operation, the encoder/decoder 17 generates parity based on the write data, and adds the parity to the write data. The write data with the parity is written to the NAND memory 5 as encoded data. In the read operation, the encoder/decoder 17 generates syndrome based on the parity included in the read data, and determines whether or not the read data includes an error based on the syndrome. If the read data includes an error, the encoder/decoder 17 specifies a position of the error and corrects the error. The number of errors to be correctable by the encoder/decoder 17 is determined based on a bit number of the parity, for example. If the read data includes the number of errors exceeding the correctable limit, the encoder/decoder 17 cannot execute the error correction. In that case, the encoder/decoder 17 fails the error correction. When failing the error correction, a retry read operation using the retry read table of FIG. 5 and the second correction value table of FIG. 13 will be executed.

The CPU 12 is a processor configured to control the host I/F 11, the NAND I/F 13, the DRAM I/F 14, the SRAM 16, and the encoder/decoder 17. The CPU 12 loads a control program (may be referred to as firmware) from the NAND memory 5 or a ROM (not shown) to the DRAM 6 in response to the turning on of the SSD 3, and executes various operations by executing the firmware. The firmware may be loaded to the SRAM 16. The CPU 12 can execute, for example, a command operation to process various commands from the host 2. The control of the operations of the CPU 12 is executed in accordance with the firmware. Note that, a part of or the entire command operation may be executed by a specific hardware in the controller 4.

(Memory Chip)

FIG. 2 illustrates an example of a structure of each of the memory chips 30. Each of the memory chips 30 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generator circuit 120.

The chip control circuit 112 is a state transition circuit based on various control signals received via the control signal processing circuit 111. The chip control circuit 112 controls the operation of each of the memory chips 30. The RY/BY generator circuit 120 transmits the condition of an RY/BY signal line between a ready condition (RY) and a busy condition (BY) under control by the chip control circuit 112.

The I/O signal processing circuit 110 is a buffer circuit to transmit/receive the I/O signal to/from the NAND I/F 13. The command, the address to designate an access destination, and the data which are latched by the I/O signal processing circuit 110 are distributed to and stored in the address register 114, command register 113, and data register 116, respectively.

The address stored in the address register 114 includes a chip number, a row address, and a column address. The chip number is identification information to identify the memory chip 30. The chip number is transmitted to the chip control circuit 112, and the row address is transmitted to the row decoder 119, and the column address is transmitted to the column decoder 115.

The control signal processing circuit 111 receives an input of the control signal. The control signal processing circuit 111 determines a storage destination register of the I/O signal received by the I/O signal processing circuit 110 based on the received control signal. The control signal processing circuit 111 transmits the received control signal to the chip control circuit 112.

(Memory Cell)

FIG. 3 illustrates an example of the memory cell array 118. The memory cell array 118 includes a plurality of blocks BLK as shown in FIG. 1. The blocks BLK are arranged in the first direction (may be referred to as y direction). Each block BLK includes a plurality of string units arranged in the y direction, for example, four string units SU0 to SU3 (if there is no need to distinguish, may be referred to as string units SU). Note that, each block BLK may include only one string unit SU.

A plurality of bit lines BL0 to BLp−1 each extending in the y direction (if there is no need to distinguish, may be referred to as bit lines BL) are respectively connected to p strings STR arranged in an x direction, included in each string unit SU of each block BLK.

Each string STR includes a selection gate transistor ST, a plurality of, for example, eight memory cell transistors MT0, MT1, MT2, MT3, MT4, MT5, MT6, and MT7 (if there is no need to distinguish, may be referred to as memory cell transistors MT), and selection gate transistors DT0, DT1, . . . (if there is no need to distinguish, may be referred to as selection gate transistors DT). The memory cell transistor MT corresponds to a memory cell. The selection gate transistor ST, the memory cell transistor MT, and the selection gate transistor DT are connected in series between a source line CELSRC and bit line BL in this order. The memory cell transistors MT0 to MT7 respectively include control gate electrodes connected to word lines WL0 to WL7 (if there is no need to distinguish, may be referred to as word lines WL), and charge accumulation layers insulated from the periphery. The memory cell transistor MT stores data based on an amount of charge in the charge accumulation layer in a nonvolatile manner.

The memory cell transistor MT includes a metal oxide semiconductor field effect transistor (MOSFET) including a layered gate structure formed on a semiconductor substrate. The layered gate structure includes a floating gate formed via a tunnel oxidation film and a control gate electrode formed in the floating gate via an insulating film. A threshold voltage of the memory transistor MT changes based on the number of electrons accumulated in the floating gate. The memory cell transistor MT stores data based on a difference in the threshold voltage. That is, the memory cell transistor MT accumulates the charge amount of which is based on the data in the floating gate.

A plurality of strings STR respectively connected to different bit lines BL form a string unit SU. In each string unit SU, the control gate electrode of the memory cell transistor MT is connected to the word line WL. In each block BLK, word lines WL of the same address are mutually connected over the different string units SU. Memory cell transistors MT sharing the word line WL in one string unit may be referred to as a cell unit CU.

The selection gate transistor DT belongs to the string unit SU. Gates of the selection gate transistors DTα of the strings STR of string units SUα (α=0 to 3) are connected to the selection gate line SGDLα. Gates of the selection gate transistors ST of the strings STR are connected to selection gate lines SGSL.

The memory cell transistor MT will be explained. The memory cell transistor MT may be a single level cell (SLC) which can store one bit data in a transistor (memory cell), or may be a multi-level cell which can store N-bits data (N is an integer which is two or more).

The multi-level cell includes a multiple level cell (MLC) which can store two-bit data in a memory cell transistor, a triple level cell (TLC) which can store three-bit data in a memory cell transistor, a quad level cell (QLC) which can store four-bit data in a memory cell transistor, and a multi-level cell which can store five-bit or more data in a memory cell transistor.

In the following description, as an example of the multi-level cell, the TLC will be used. However, the embodiments can be applied to the MLC and the QLC. In a case where the TLC is used, data of three pages is stored in one cell unit CU connected to each word line WL. As to the three pages connected to a word line, a page to be written first may be referred to as a lower page, a page to be written next to the lower page may be referred to as a middle page, and a page to be written next to the middle page may be referred to as an upper page. Note that data of the three pages may be simultaneously written.

Figure 4:
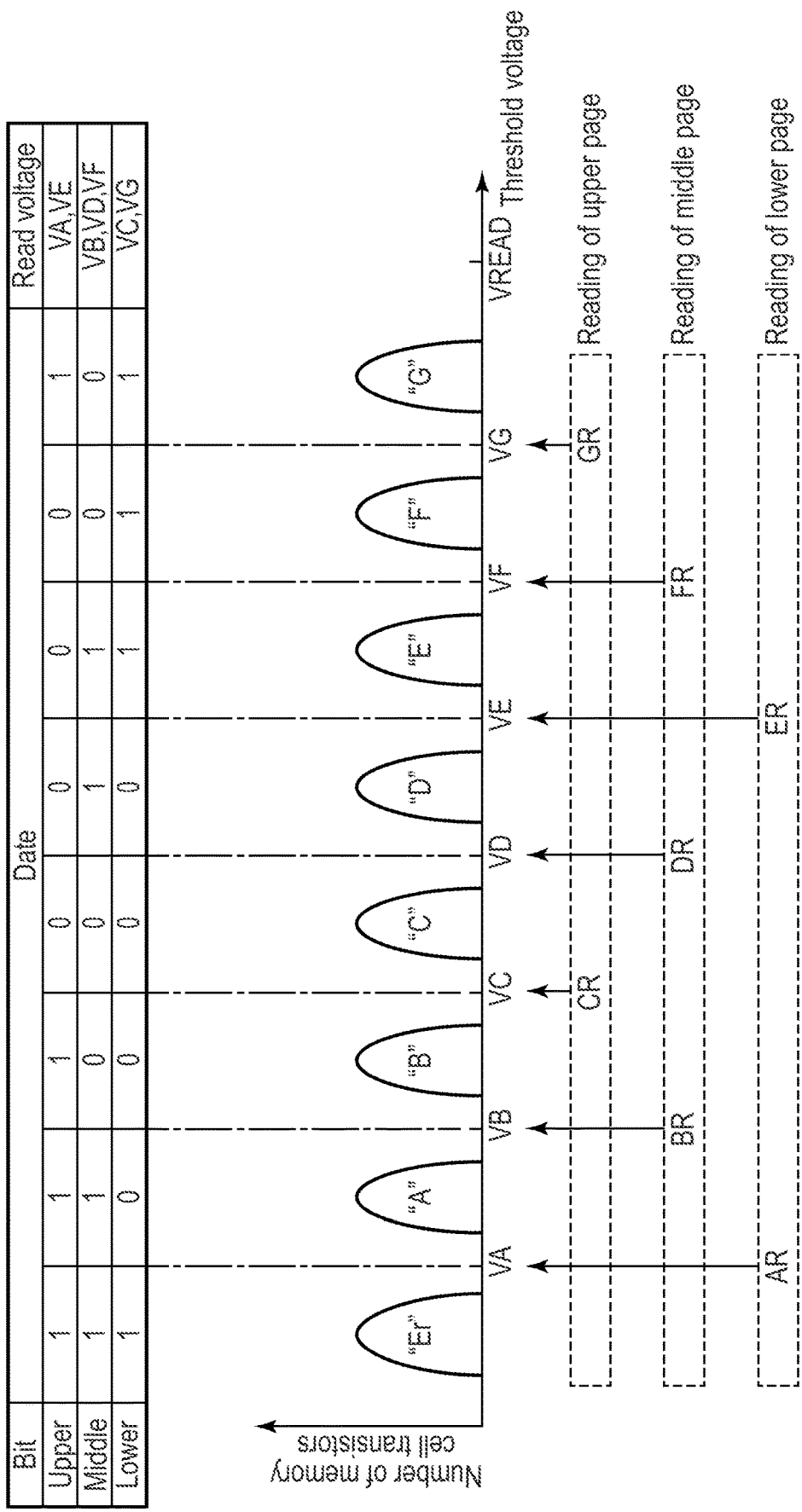
FIG. 4 is an example of a threshold voltage distribution after writing data to a TLC memory cell transistors.

FIG. 4 illustrates an example of a threshold voltage distribution after writing data to the TLC memory cell transistors. Different memory cell transistors MT storing the same three-bit data may include slightly different threshold voltages after writing because of variation in the characteristics of the memory cell transistors MT, for example. Thus, the threshold voltages of the memory cell transistors MT storing the same three-bit data are in a distribution.

The threshold voltage of the memory cell transistor MT corresponds to the data stored therein. The memory cell transistor MT can store three-bit data xyz defined by data x of the upper page, data y of the middle page, and data z of the upper page. Data x, y, and z are 0 or 1.

The threshold voltage of the TLC memory cell transistor MT is controlled to belong to one of eight threshold voltage distributions "Er", "A", "B", "C", "D", "E", "F", and "G". In this example, the memory cell transistor with the threshold voltage belonging to the threshold voltage distribution "Er" stores data 111. The memory cell transistor with the threshold voltage belonging to the threshold voltage distribution "A" stores data 110. The memory cell transistor with the threshold voltage belonging to threshold voltage distribution "B" stores data 100. The memory cell transistor with the threshold voltage belonging to the threshold voltage distribution "C" stores data 000. The memory cell transistor with the threshold voltage belonging to the threshold voltage distribution "D" stores data 010. The memory cell transistor with the threshold voltage belonging to the threshold voltage distribution "E" stores data 011. The memory cell transistor with the threshold voltage belonging to the threshold voltage distribution "F" stores data 001. The memory cell transistor with the threshold voltage belonging to the threshold voltage distribution "G" stores data 101. The threshold voltage of the memory cell transistor MT storing data 111 belongs to the lowest threshold voltage distribution "Er". The threshold voltage of the memory cell transistor MT storing data 101 belongs to the highest threshold voltage distribution "G". In this example, a corresponding relationship between the threshold voltage distributions and stored data is set such that a Hamming distance between adjacent threshold voltage distributions becomes 1.

Note that the relationship between the threshold voltage distribution of the memory cell transistor MT and the three-bit data stored is not limited to the aforementioned example. For example, the threshold voltage distribution of the memory cell transistors MT storing data 111 may be highest, and the threshold voltage distribution of the memory cell transistors MT storing data 101 may be lowest. That is, the memory cell transistor with the threshold voltage belonging to the distribution "G" may store data 111, and the memory cell transistor with the threshold voltage belonging to the distribution "Er" may store data 101.

To distinguish the data stored by the memory cell transistor MT as a read target, the condition of the memory cell transistor MT is determined. To determine the condition, any of the read voltages VA, VB, VC, VD, VE, VF, and VG is applied to the memory cell transistor MT.

Based on whether or not the threshold voltage of the memory cell transistor to be read exceeds any of the read voltages VA to VG, the condition of the memory cell transistor MT can be determined. The memory cell transistor MT having a threshold voltage equal to or more than the read voltages VA to VG maintains to be off even if receiving the read voltages VA to VG in the control gate electrode. On the other hand, the memory cell transistor MT having a threshold voltage below the read voltages VA to VG is turned on if receiving the read voltages VA to VG in the control gate electrode.

Voltage VREAD is applied to the word line WL of the memory cell transistor MT of the cell unit CU which is not a read target. Voltage VREAD is higher than the threshold voltage of the memory cell transistor MT in any of the distributions "Er", and "A" to "G".

The memory cell transistor MT with the threshold voltage belonging to the distribution "Er" is in a condition where a charge is discharged from the charge accumulation layer such as the floating gate and thus the data is erased. The memory cell transistor MT with the threshold voltage belonging to the distributions "A" to "G" is in a condition where a charge is accumulated in the charge accumulation layer such as the floating gate and thus the data is written.

Bit data of the same position (digit) in the memory cell transistors MT of the cell unit CU form a page.

Data of a page, for example, data of the lower page is determined by a read "A" using the read voltage VA and a read "E" using the read voltage VE. A read using the read voltage Vβ (β is A, B, C, D, E, F, or G) may be referred to as a read "β". In FIG. 4, the read "β" is denoted as βR.

That is, whether the threshold voltage of the memory cell transistor MT as a read target belongs to the distribution "Er" or the distribution "A", "B", "C", "D", "E", "F", or "G" is determined by the read "A".

Furthermore, whether the threshold voltage of the memory cell transistor MT as a read target with the threshold voltage distribution "A", "B", "C", "D", "E", "F", or "G" belongs to the distribution "A", "B", "C", or "D" or the distribution "E", "F", or "G" is determined by the read "E".

If the threshold voltage of the memory cell transistor MT as a read target belongs to the distribution "Er", "E", "F", or "G", it is determined that data 1 is stored in the lower page. If the threshold voltage of the memory cell transistor MT as a read target belongs to the distribution "A", "B", "C", or "D", it is determined that data 0 is stored in the lower page.

The same applies to the middle page and the upper page. In the read of the middle page, data stored in the memory cell transistor MT as a read target in the middle page is determined by the "B" read, the "D" read, and the "F" read. In the read of the upper page, data stored in the memory cell transistor MT as a read target in the upper page is determined by the "C" read and the "G" read.

Write and read with respect to the memory cell array 118 will be explained with reference to FIGS. 2, 3, and 4. The row decoder 119, the column decoder 115, the data register 116, and the sense amplifier 117 form peripheral circuits of the memory cell array 118. The peripheral circuits access to the memory cell array 118 based on the control by the chip control circuit 112. The access includes read (sense), write (program), and erase.

In the write operation, the column decoder 115 selects and activates a bit line BL corresponding to a column address. The sense amplifier 117 sets the voltage of the bit line BL selected by the column decoder 115 to 0 volt. The row decoder 119 applies a write pulse to a word line WL corresponding to the row address. Electrons are injected to a floating gate of a memory cell transistor MT positioned at a crossing point of the selected bit line BL and the selected word line WL. As a result, the threshold voltage of the floating gate increases. The sense amplifier 117 confirms whether or not the threshold voltage reaches a voltage corresponding to write data stored in the data register 116 at each time when a write pulse is applied thereto. The application of the write pulse is continued until the threshold voltage reaches the voltage corresponding to the write data.

In the read operation, the sense amplifier 117 pre-charges the bit line BL with the power source voltage Vcc, and the row decoder 119 applies any of the read voltages VA to VG to the selected word line WL. Note that the row decoder 119 applies a transfer voltage to a non-selected word line WL to maintain a memory cell transistor MT connected to the non-selected word line WL as a conductive condition. The sense amplifier 117 detects whether or not the charge accumulated by the pre-charge flows to the source line SL when any of the read voltages VA to VG is applied. Thus, data stored in a target memory cell transistor MT is determined.

In the erase operation, an erase voltage is applied to the substrate of the memory cell array 118 by a voltage generation circuit (not shown). By the row decoder 119, all word lines WL of an erase target block BLK are connected to a ground voltage terminal. In each memory cell transistor MT in a selected block BLK, the charge accumulated in the floating gate is discharged. As a result, the condition of each memory cell transistor MT in the selected block BLK is changed to an erase condition (that is, a condition storing data 111).

The sense amplifier 117 writes the data read from the NAND memory 5 to the data register 116. The data stored in the data register 116 is transmitted to the I/O signal processing circuit 110 through the data line, and is transmitted from the I/O signal processing circuit 110 to the controller 4.

Each of the read voltages VA to VG is stored in the management data area in the NAND memory 5. As will be described later, in the retry read operation, the read voltage may be changed. The read voltage stored in the management data area in the NAND memory 5 is a reference value. A current value of the read voltage after the change is stored in the DRAM 6. As the reference value of each of the read voltages VA to VG, the same value may be set for the memory chips 30, or different values may be respectively set for the memory chips 30. Furthermore, as the reference value of each of read voltages VA to VG, the same value may be set for blocks of a memory chip 30, or different values may be respectively set for the blocks or units different from the blocks (for example, a single or multiple physical addresses) of the memory chip 30. The method of setting the reference value is not limited to a specific method. The controller 4 may set the reference value of each of the read voltages VA to VG by transmitting a predetermined instruction to a target memory chip 30.

(Retry Read)

In the memory cell transistor MT, the charge accumulated in the floating gate changes as time passes. Furthermore, the charge accumulated in the floating gate in the memory cell transistor MT changes by the read operation of the memory cell transistor MT or the write operation of an adjacent memory cell transistor MT. When the charge accumulated in the floating gate of the memory cell transistor MT changes, the threshold voltage of the memory cell transistor MT changes. Thus, tails of adjacent two threshold voltage distributions may overlap. Thus, data written as 0 or 1 will be read as 1 or 0, respectively. The read data changed from the write date is detected as an error (error bit) in the controller 4 in the read operation.

The controller 4 executes an error correction of the error bit in the read data using the encoder/decoder 17. The controller 4 obtains the write data if the error is corrected (if the read operation succeeds). However, if the controller 4 cannot correct the error using the encoder/decoder 17 (if the read operation fails), the data is re-read with changing the read voltage. By re-reading the data with changing the read voltage, the number of the error bit in the read data may become small, and the read operation may succeeds. The re-reading operation of data changing the read voltage may be referred to as retry read operation. The controller 4 re-executes the error correction using the encoder/decoder 17 with respect to the data read by the retry read operation.

The method of changing the read voltage at the time of the retry read operation is not limited to a specific method. In the embodiments, the retry read table 22 storing correction values for the read voltage in each retry read operation is prepared. If decoding of the read data fails by the error correction, before the retry read operation, a current value of the read voltage is changed based on the voltage indicated by the correction value read from the retry read table 22.

Figure 10:
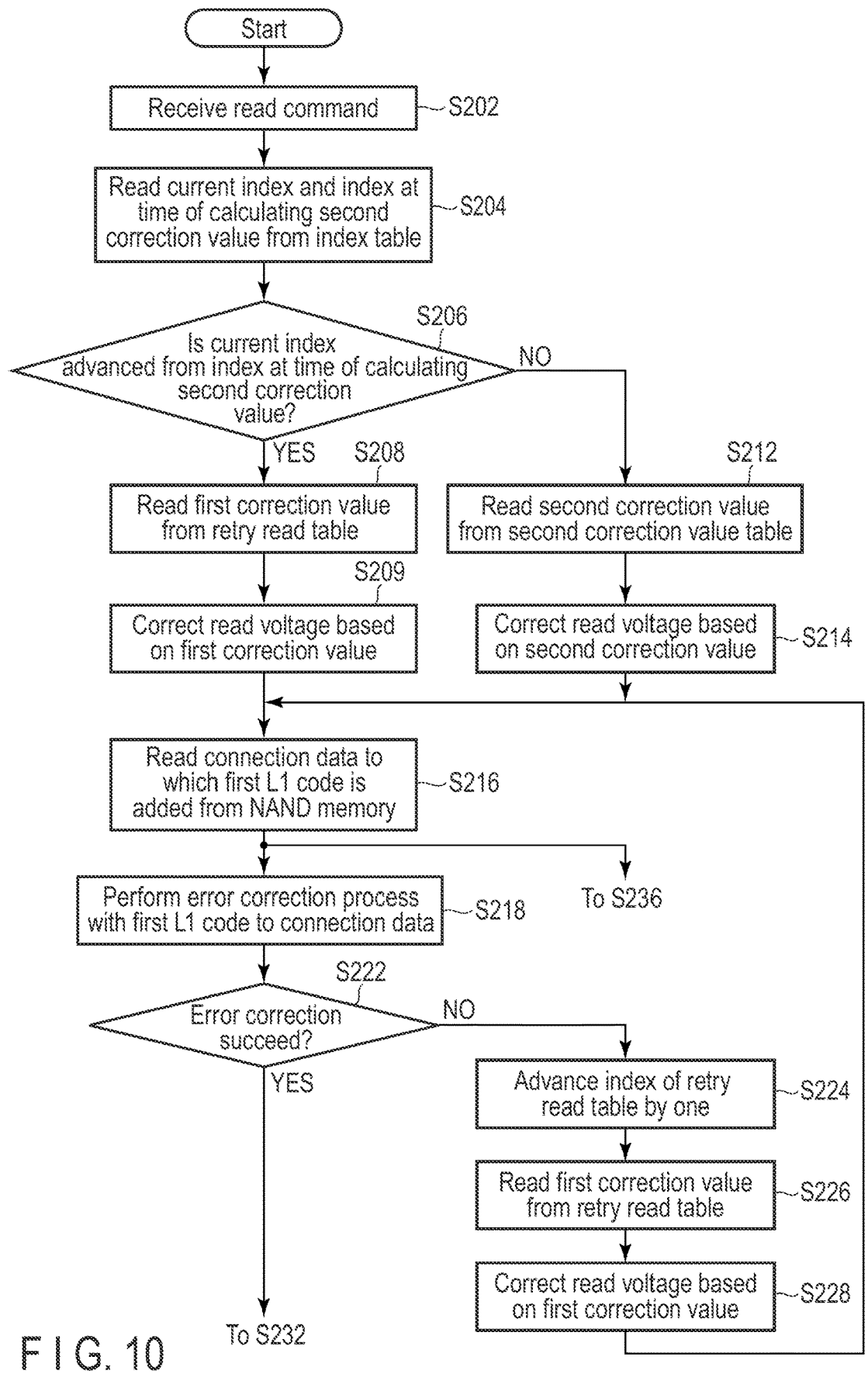
FIG. 10 is a flowchart of a part of an example of a read operation in the first embodiment.

Note that, in the embodiment, as shown in FIG. 10, the read voltage is changed before the first read operation with respect to each read command. Thus, a correction value to change the read voltage at the time of retry read operation due to the failed error correction (second and subsequent read operations with respect to each read command) may be referred to as a first correction value. Furthermore, a correction value to change the read voltage at the time of the first read operation other than the retry read operation (the first read operation with respect to each read command) may be referred to as a second correction value. The retry read table 22 used in the retry read operation may be referred to as a first correction value table.

FIG. 5 illustrate an example of a retry read table 22. The retry read table 22 stores the first correction value to change the read voltage of each of read voltages VA to VG. The controller 4 supplies the correction value read from the retry read table 22 to the NAND memory 5. The NAND memory 5 includes a D/A converter which converts the correction value for the read voltage (digital signal) to an analogue signal. The first correction value is denoted by a dac number which is a conversion unit of D/A converter. For example, 1 dac corresponds to but not limited to 25 mV.

The first correction value is set per index indicative of the number of retry read operations (for example, #0 to #63). Index #0 corresponds to the first read operation, and the first retry read operation (a second read operation in total) corresponds to index #1. The first correction value in a case where the index is #0 is all 0 with respect to the read voltages VA to VG. In the read operation of each time, the current value of the read voltage is changed to the voltage corresponding to the first correction value. The read characteristics of the NAND memory 5 changes depending on the physical positions, and thus, different first correction values may be set to physical positions of the NAND memory 5, that is, per chip, per block, or per physical address.

Note that, if a certain cell is repeatedly read, other cells near the certain cell may be affected. Furthermore, there may be a case where the read can be executed properly in a method other than the retry read method. Thus, the index of the retry read table 22 is limited. When the index is incremented by one per retry read operation, the index of the retry read table 22 may reach the upper limit. Thus, instead of only in one retry read operation, the index may be incremented by one per several retry read operations. Furthermore, if the index reaches a certain value, the read operation may be re-executed in another method. If the read operation is re-executed by another method succeeds, the index may be changed to one corresponding to the read voltage at that time.

(Write Operation)

An example of write operation and read operation in the first embodiment will be explained. FIG. 6 is a flowchart indicative of an example of the write operation.

The controller 4 receives a write command from the host 2 in S102 of FIG. 6. The controller 4 randomizes write data in accordance with the write command in S104. Note that the randomization of S104 requires every write data per write unit. Note that, since the memory cell is TLC, the randomization is executed when the write data of three pages are received.

The controller 4 calculates an expected bit count (EBC) of each of the read voltages VA to VG from the randomized write data in S106. The EBC is an expected value of bit number expected to be obtained when the write data written to the NAND memory 5 is read by using each of the read voltages VA to VG. EBCs corresponding to each of the read voltages VA to VG may be referred to $EBC_A$ to $EBC_G$ (if there is no need to distinguish, may be referred to the EBC).

An example of calculation of the EBC is explained.

Initially, how to calculate the EBC in the MLC memory cell will be explained with reference to FIG. 7 for the convenience of explanation.

An information vector of the lower page is represented as $l=(l0, l1, l2, \ldots, lk-1)$.

An information vector of the upper page is represented as $u=(u0, u1, u2, \ldots, uk-1)$.

Note that k is a length of the information vector.

$ln \in \{0, 1\}$, $un \in \{0, 1\}$, and n is an element number.

The information vectors of the lower page and the upper page do not include an error.

The $EBC_A$ represents an expected number of the number of the memory cells to which a voltage lower than VA is applied and the charge corresponding to the applied voltage is charged, and is an element number of the information vector of li&ui=1, where & represents AND operation.

A formula to calculate the $EBC_A$ is as follows.

```
for (i=0, i < k, i++) {
    if(li&ui)count++;
}
```

That is, a sum of the memory cells in which bits of the lower page and the upper page are both 1 is the $EBC_A$.

The $EBC_B$ represents an expected number of the number of the memory cells to which a voltage lower than VB is applied and the charge corresponding to the applied voltage is charged, and is an element number of the information vector of li&1=1.

A formula to calculate the $EBC_B$ is as follows.

```
for (i=0, i < k, i++) {
    if(li&1)count++;
}
```

That is, a sum of the memory cells in which a bit of the lower page is 1 is the $EBC_B$.

The $EBC_C$ represents an expected number of the number of the memory cells to which a voltage lower than VC is applied and the charge corresponding to the applied voltage is charged, and is an element number of the information vector of li|~ui=1. Note that | represents OR operation, and ~ represents NOT operation.

A formula to calculate the $EBC_C$ is as follows.

```
for (i=0, i < k, i++) {
    if(li | ~ui)count++;
}
```

That is, a sum of the memory cells in which a bit of the lower page is 1 or a bit of the upper page is 0 is the $EBC_C$.

Now, how to calculate the EBC in the TLC memory cells will be explained with reference to FIG. 8.

An information vector of the lower page is represented as $l=(l0, l1, l2, \ldots, lk-1)$.

An information vector of the middle page is represented as $m=(m0, m1, m2, \ldots, mk-1)$.

An information vector of the upper page is represented as u=(u0, u1, u2, . . . , uk−1).

Note that k is a length of the information vector.

ln∈{0, 1}, mn∈{0, 1}, and un∈{0, 1}, and n is an element number.

Information vectors of the lower page, the middle page, and the upper page do not include an error.

The $EBC_A$ represents an expected number of the number of the memory cells to which a voltage lower than VA is applied and the charge corresponding to the applied voltage is charged, and is an element number of the information vector of li&mi&ui=1.

A formula to calculate the $EBC_A$ is as follows.

```
for (i=0, i < k, i++) {
  if(li&mi&ui)count++;
}
```

That is, a sum of the memory cells in which bits of the lower page, the middle page, and the upper page are 1 is the $EBC_A$.

The $EBC_B$ represents an expected number of the number of the memory cells to which a voltage lower than VB is applied and the charge corresponding to the applied voltage is charged, and is an element number of the information vector of mi&ui=1.

A formula to calculate the $EBC_B$ is as follows.

```
for (i=0, i < k, i++) {
  if(mi&ui)count++;
}
```

That is, a sum of the memory cells in which bits of the middle page and the upper page are both 1 is the $EBC_B$.

The $EBC_C$ represents an expected number of the number of the memory cells to which a voltage lower than VC is applied and the charge corresponding to the applied voltage is charged, and is an element number of the information vector of ~li&ui|mi&ui=1.

A formula to calculate the $EBC_C$ is as follows.

```
for (i=0, i < k, i++) {
  if((~li&ui) | (mi&ui))count++;
}
```

That is, a sum of the memory cells in which a bit of the lower page is 1 and a bit of the upper page is 1 or bits of the middle page and the upper page are both 1 is the $EBC_C$.

The $EBC_D$ represents an expected number of the number of the memory cells to which a voltage lower than VD is applied and the charge corresponding to the applied voltage is charged, and is an element number of the information vector of ~li&~mi|mi&ui=1.

A formula to calculate the $EBC_D$ is as follows.

```
for (i=0, i < k, i++) {
  if((~li&~mi) | (mi&ui))count++;
}
```

That is, a sum of the memory cells in which bits of the lower page and the middle page are 0, or bits of the middle page and the upper page are 1 is the $EBC_D$.

The $EBC_E$ represents an expected number of the number of the memory cells to which a voltage lower than VE is applied and the charge corresponding to the applied voltage is charged, and is an element number of the information vector of mi&~ui|~li=1.

A formula to calculate the $EBC_E$ is as follows.

```
for (i=0, i < k, i++) {
  if((mi&ui) | ~ui)count++;
}
```

That is, a sum of the memory cells in which bits of the middle page and the upper page are both 1, or a bit of the lower page is 0 is the $EBC_E$.

The $EBC_F$ represents an expected number of the number of the memory cells to which a voltage lower than VF is applied and the charge corresponding to the applied voltage is charged, and is an element number of the information vector of ~li|mi=1.

A formula to calculate the $EBC_F$ is as follows.

```
for (i=0, i < k, i++) {
  if(~li | mi)count++;
}
```

That is, a sum of the memory cells in which a bit of the lower page is 0, or a bit of the middle page is 1 is the $EBC_F$.

The $EBC_F$ represents an expected number of the number of the memory cells to which a voltage lower than VG is applied and the charge corresponding to the applied voltage is charged, and is an element number of the information vector of ~li|~ui|mi=1.

A formula to calculate the $EBC_G$ is as follows.

```
for (i=0, i < k, i++) {
  if(~li | ~ui | mi)count++;
}
```

That is, a sum of the memory cells in which a bit of the lower page is 0, a bit of the upper page is 0, or a bit of the middle page is 1 is the $EBC_G$.

Returning to the explanation of FIG. 6, the controller 4 connects the calculated the EBC and the write data before randomization in S108. The controller 4 randomizes the connection data (the EBC and the write data before randomization) in S112.

The controller 4 adds a first error correction code (may be referred to as a first L1 code) per particular size (may be referred to as a frame) to the randomized connection data and encodes the connection data in S114.

The controller 4 writes the randomized connection data encoded by the first L1 code to the NAND memory 5 in S116. As described above, the EBC is written to the NAND memory 5 together with the write data.

FIGS. 9A and 9B illustrate examples of write destinations of the EBC in the NAND memory 5. As shown in FIG. 9A, the controller 4 forms one page of the NAND memory 5 with a set of a data part of a particular size and a parity part with respect to the data part, and there will be a spared unused part in one page. The controller 4 may write the EBC in the unused part. The controller 4 controls the definitions of the data part, the parity part, and the unused part. The controller 4 sets the unused part to which the EBC is written as the data part. Furthermore, as shown in FIG. 9B, each memory chip 30 in the NAND memory 5 includes a spare column other than the blocks. The controller 4 may write the EBC to the spare column.

(Read Operation)

Figure 11:
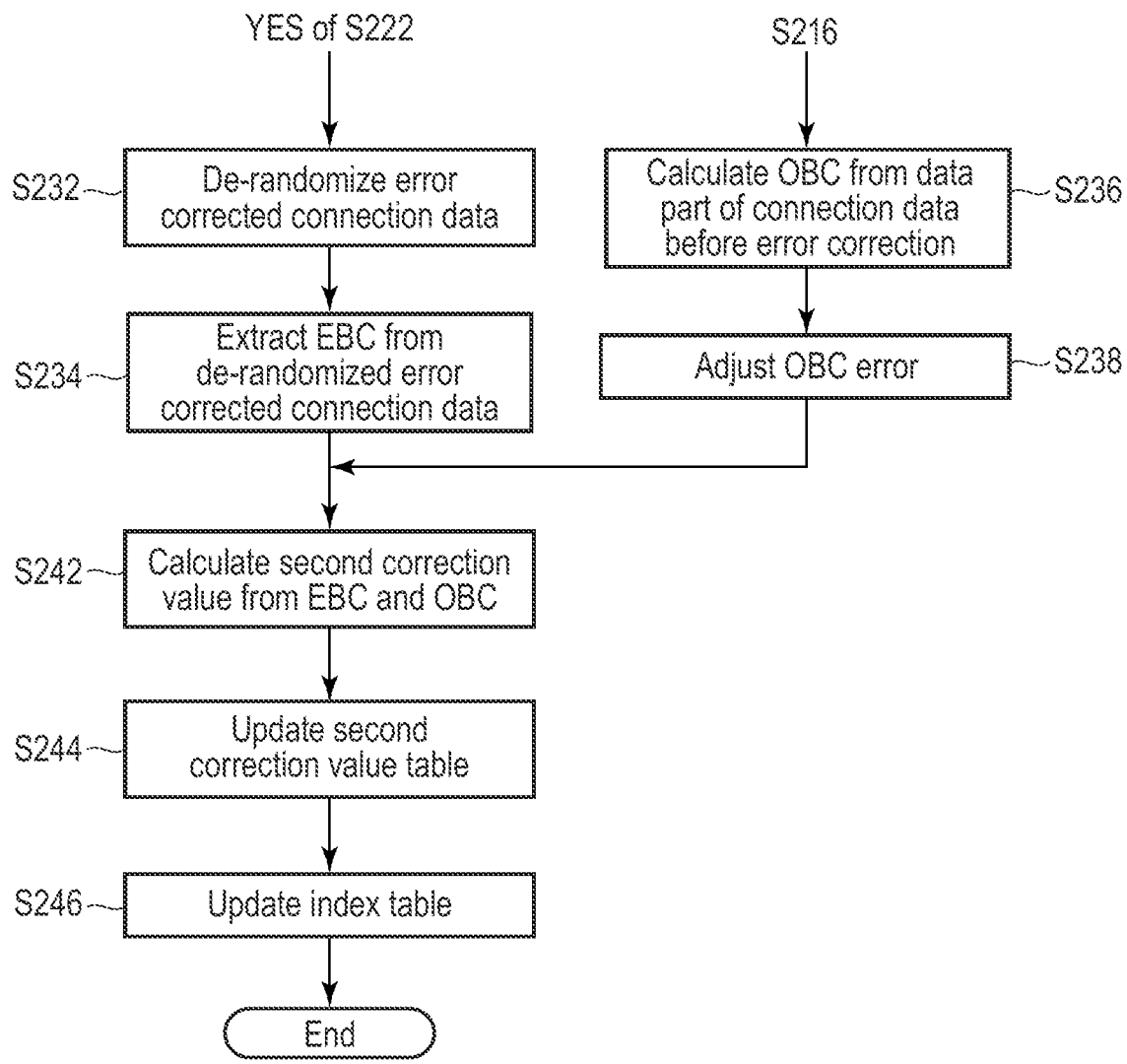
FIG. 11 is a flowchart of other part of the example of the read operation in the first embodiment.

FIGS. 10 and 11 illustrate a flowchart of an example of read operation.

The controller 4 receives a read command from the host 2 in S202 of FIG. 10. The controller 4 reads, in S204, an index corresponding to a physical address specified by the read command from the index table 24.

FIG. 12 illustrates an example of the index table 24. The index table 24 stores the index of the retry read table 22. The index is stored in per physical address. The index may be stored in per logical address such as LBA. A current index and an index at the time of calculating the second correction value (S242 of FIG. 11) are stored in the index table 24. As described above, in the embodiment, the read voltage is changed before the first read operation with respect to each read command. The second correction value is a correction value to change the read voltage at the time of read operation which is not the retry read operation (first read operation with respect to each read command). The first correction value is a correction value to change the read voltage at the time of the retry read operation (second and subsequent read operations with respect to each read command). The current index is incremented (or advanced) by one before the retry read operation (S224 of FIG. 10) and updated.

Since the index table 24 stores the index when the second correction value is calculated, whether or not the second correction value is valid can be determined. The second correction value is a correction value per read voltage. Thus, the second correction value is invalid unless the read voltage at the time of calculating the second correction value and the read voltage at the time to be corrected with the second correction value (that is, current read voltage) are the same. Whether or not the second correction value is valid can be determined by checking if the current index in the index table 24 is the same as or more than the index at the time of calculating the second correction value. That is, the controller 4 reads from the index table 24, the current index and the index at the time of calculating the second correction value in S204.

Returning to FIG. 10, in S206, the controller 4 compares both indices, refers to the retry read table 22, and determines whether or not the current index is advanced from the index at the time of calculating the second correction value.

If the current index is advanced from the index at the time of calculating the second correction value (YES in S206), the controller 4 reads the first correction value of the current index from the retry read table 22 in S208. The controller 4 corrects the read voltages VA to VG based on the first correction value in S209. Specifically, the controller 4 adds the voltage corresponding to the first correction value to the reference value of the read voltage, and corrects the current value of the read voltage. That is, if the current index is advanced from the index at the time of calculating the second correction value, the controller 4 uses the first correction value read from the retry read table 22 instead of the second correction value in order to correct the read voltage.

If the index of the retry read table 22 is not advanced from the index at the time of calculating the second correction value, that is, if they are the same (NO in S206), the controller 4 reads the second correction value from the second correction value table 26 in S212.

FIG. 13 illustrates an example of the second correction value table 26. The second correction value table 26 stores the second correction value for each of the read voltages VA to VG. The second correction value may be set different per physical storage positions of the NAND memory 5, for example, per block or per unit which is not the block (for example, single or multiple physical addresses). FIG. 13 illustrates an example where the second correction value for each of the read voltages VA to VG is stored per physical address.

Returning to the explanation of FIG. 10, the controller 4 corrects the read voltages VA to VG based on the second correction value in S214. Specifically, the controller 4 adds a voltage corresponding to the second correction value to the current value of the read voltage, and corrects the read voltage.

Upon completion of S209 or S214, the controller 4 reads connection data to which the first L1 code is added from the NAND memory 5 in S216. The read voltage at the time of reading is the read voltage corrected in S209 or S214.

When the data per write unit, that is, since the example of the TLC memory cell is explained here, three page data is read, the controller 4 executes the error correction with the first L1 code to the connection data, and obtains the connection data.

The controller 4 determines whether or not the error correction succeeds (read operation succeeds) in S222.

When the data per write unit is read, the controller 4 calculates an observed bit count (OBC) from the data part of the connection data before error correction in S236 of FIG. 11. The OBC is a measured value of the bit number obtained when the write data written in the NAND memory 5 is read by using each of the read voltages VA to VG. OBCs corresponding to each of the read voltages VA to VG may be referred to as $OBC_A$ to $OBC_G$ (if there is no need to distinguish, may be referred to as the OBC).

The OBC is calculated as with the calculation of the EBC shown in FIGS. 7 and 8. Note that, in a case where the EBC is calculated, the information vectors of the lower page and the upper page (or the lower page, the middle page, and the upper page) do not include an error while in a case where the OBC is calculated, the information vectors of the lower page and the upper page (or the lower page, the middle page, and the upper page) may include an error. In the calculation of the OBC, the information vector may include an error since the threshold voltage distribution of the memory cell changes.

The controller 4 adjusts an OBC error in S238. The OBC is calculated from the data part of the connection data before the error correction, and includes an error due to an EBC part included in the connection data. The OBC error can be adjusted in consideration of the bit of the EBC part of the error corrected connection data.

If the read voltage is optimal, the OBC and the EBC should match. If they do not match, it is considered that the threshold voltage distribution of the cell changes. Thus, if the OBC is shifted from the EBC, it is highly possible that they become equal by changing the read voltage.

If the error correction fails (NO in S222), the controller 4 advances the current index by one in S224, increments the current index in the index table 24 by one, and updates the index table 24. As described above, if the index of the retry read table 22 is incremented by one each time when the error correction fails, the index of the retry read table 22 may reach the upper limit. In order to avoid this, the index may be incremented by one per several retry read operations instead of one retry read operation.

The controller 4 reads the first correction value of the current index from the retry read table 22 in S226. The controller 4 corrects the read voltages VA to VG based on the first correction value in S228. Specifically, the controller 4 corrects the read voltage by adding a voltage based on the first correction value to the current value of the read voltage.

Then, the controller 4 executes the retry read. That is, the controller 4 reads the connection data encoded with the first L1 code from the NAND memory 5 in S216, and executes the error correction using the first L1 code to the read data to obtain the connection data. The read voltage at the time of read is the read voltage corrected in S228.

If the error correction succeeds (YES in S222), the controller 4 de-randomizes the error corrected connection data in S232 in FIG. 11. The controller 4 extracts the EBC from the de-randomized connection data in S234.

The controller 4 calculates the second correction value for each of the read voltages VA to VG from the EBC and the OBC in S242 after completion of S234 and S238. The second correction value is a correction value for the read voltage at the time of calculating the OBC. The read voltage at the time of calculating the OBC is corrected by the first correction value as shown in S224, S226, and S228 of FIG. 10.

Furthermore, in the first read operation for the next read command, as shown in S212 and S214 of FIG. 10, the read voltage corrected based on the second correction value which is set such that a difference between the EBC read from the NAND memory 5 and the OBC calculated from the data by which the error correction has succeeded becomes 0. Thus, an optimal read voltage can be set as the read voltage in the first read operation for the next read command, and a possibility of failure in the error correction in the first read operation for the next read command becomes lower. Thus, a possibility of occurrence of retry read becomes lower.

The controller 4 writes the second correction value to the second correction value table in S244 after S242, and updates the second correction value table 26. If, in S246, the current index differs from the index at the time of calculating the second correction value (that is, the current index at the time of calculating the second correction value in S242) in the index table 24, the controller 4 rewrites the index at the time of calculating the second correction value in the index table 24 with the current index and updates the index table 24.

Figure 14:
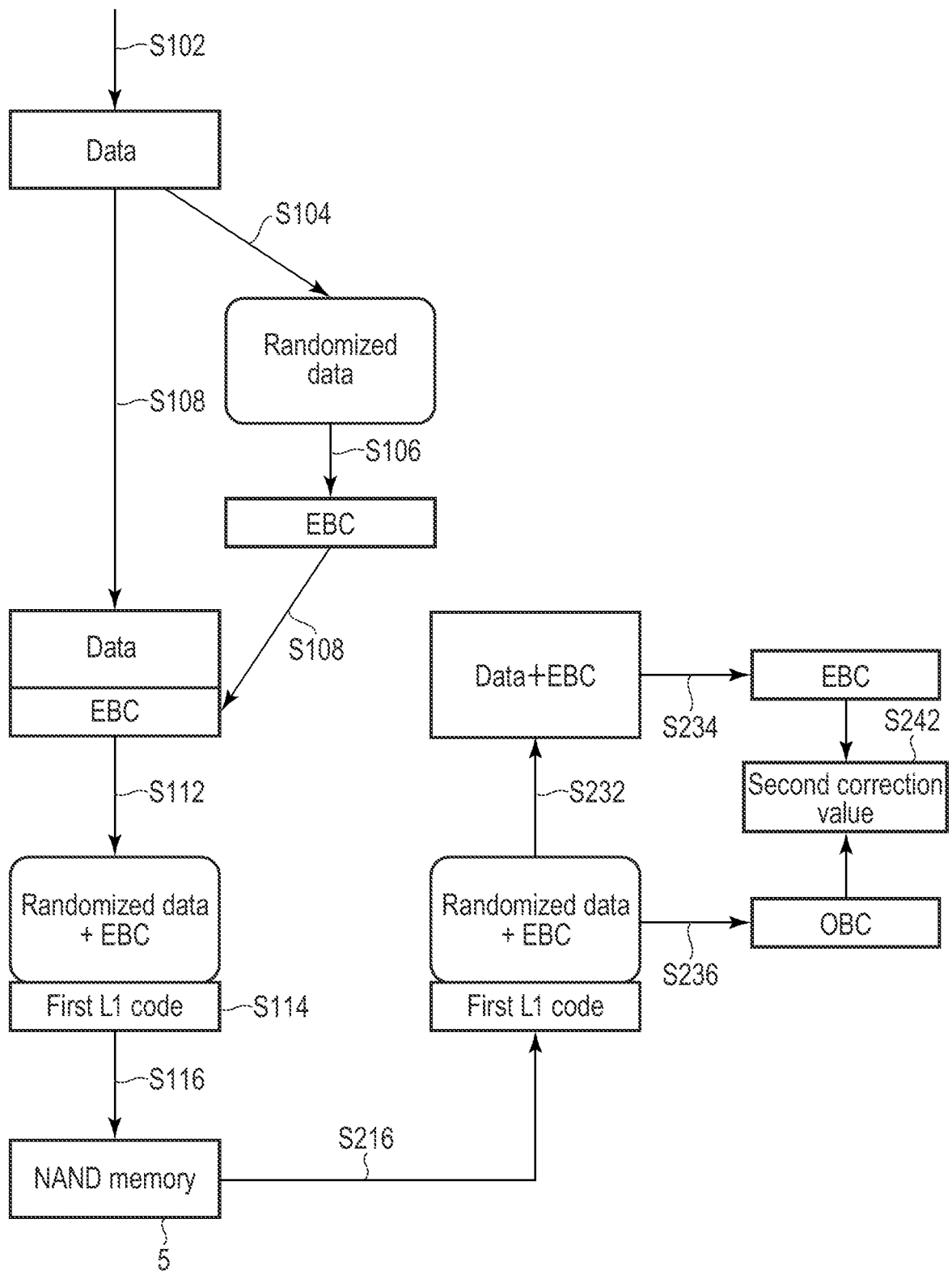
FIG. 14 is a schematic view of an example of the write operation and the read operation of the first embodiment.

FIG. 14 illustrates an outline of an example of the read operation of FIG. 6 and the write operation of FIGS. 10 and 11. FIG. 14 illustrates the write operation and the read operation by showing the transitions of data. In FIG. 14, round-corner data indicates randomized data. Reference numbers added to arrows indicate reference numbers of operations in FIGS. 6, 10, and 11. In the embodiment, in the write operation, the EBC is calculated from the randomized data (S106), and the EBC is connected to the data before randomization. The data connected is randomized and added with the first L1 code (S114), and then, written to the NAND memory 5 (S116). Furthermore, in the read operation, the OBC is calculated from the read data (S236). Furthermore, the EBC is calculated from the de-randomized read data (S234). Then, the second correction value is determined such that the OBC and the EBC become equal (S242).

(How to Calculate Second Correction Value)

Some examples of how to calculate the second correction value will be explained.

FIGS. 15A and 15B illustrate a first example of how to calculate the second correction value. In the upper side graphs of FIGS. 15A and 15B, the horizontal axis indicates the read voltage and the vertical axis indicates the EBC. The vertical axis and the horizontal axis are both linear scales. In the lower graphs of each of FIG. 15A and 15B, each graphs correspond to the threshold voltage distributions of FIG. 4, the horizontal axis indicates the read voltage, and the vertical axis indicates the number of cells. The vertical axis is a logarithmic scale and the horizontal axis is a linear scale. In this example, if a difference between the OBC and the EBC is great, the read voltages VA to VG are each corrected such that the OBC and the EBC become equal. As shown in FIG. 15A, if the OBC of the read voltage VG is greater than the EBC, the second correction value is set to −N (dac) in order to decrease the read voltage VG. Thus, the OBC and the EBC become equal. As shown in FIG. 15B, if the OBC of the read voltage VG is less than the EBC, the second correction value is set to +N (dac) in order to increase the read voltage VG. Thus, the read voltage is changed and the OBC and the EBC become equal. That is, each of the second correction values C1a, C1b, . . . , C1g, C2a, C2b, . . . , C2g, . . . in the second correction value table 26 of FIG. 13 indicates −N or +N.

The value N is a moderate-sized constant value (for example, 1 (dac)) not to change the read voltage excessively. As a result, by adding the second correction value to the read voltage to correct the read voltage, the corrected read voltage becomes above and below the optimal value alternately, and converges to the optimal value. Furthermore, if the absolute value of a difference between the EBC and the OBC is equal to or less than a certain value, the second correction value may be set to 0 as being considered as there is no difference.

In the above explanation, the value of N is a constant value, and the second correction value is constant regardless of the difference between the EBC and the OBC. However, the value of N is not a constant value, and the value N may be varied by a function based on the difference between the EBC and the OBC. For example, if the OBC is greater than the EBC, the second correction value to decrease the read voltage may be set as a function value f1(x), and if the OBC is less than the EBC, the second correction value to increase the read voltage may be set as a function value f2(x). Note that x is the absolute value of the difference between the EBC and the OBC. Note that the second correction value may be calculated from a single function f3(x) regardless of the size relationship between the OBC and the EBC. In that case, x is EBC −OBC. That is, each of the second correction values C1a, C1b, . . . , C1g, C2a, C2b, . . . , C2g, . . . of the second correction value table 26 of FIG. 13 indicates f1(x), f2(x), or f3(x).

If the difference between the OBC and the EBC is great, a function value |f1(x)|, |f2(x)|, or |f3(x)| becomes greater, and the corrected read voltage may not converge to the optimal value and may be dispersed. Thus, the upper limit may be set to the function value f1(x), f2(x), or f3(x) to moderate the second correction value.

FIG. 16 indicates an example of the second correction value table 26a used in a second example of how to calculate the second correction value. In the second example, the second correction value is preliminarily calculated based on a range of the difference between the EBC and the OBC as to each of the read voltages VA to VG, and is stored in the second correction value table 26a. The second correction value may be calculated per physical storage position of the NAND memory 5, that is, per block or per unit which is different from the block (for example, a single or multiple physical addresses). FIG. 16 illustrates an example where the second correction values are stored based on the differences between the EBC and the OBC per physical address and per read voltages VA to VG.

Divisions of the differences between the EBC and the OBC are not necessarily the same as to all physical addresses, and different divisions of the differences between the EBC and the OBC per physical address may be set. For example, the second correction values are calculated with respect to eight divisions in a physical address PB1 while the second correction values are calculated with respect to ten divisions in a physical address PB2. Furthermore, even if the absolute value of the difference between the EBC and the OBC is the same, different second correction values may be set depending on the size relationship between the EBC and the OBC.

Figures 17, 18:
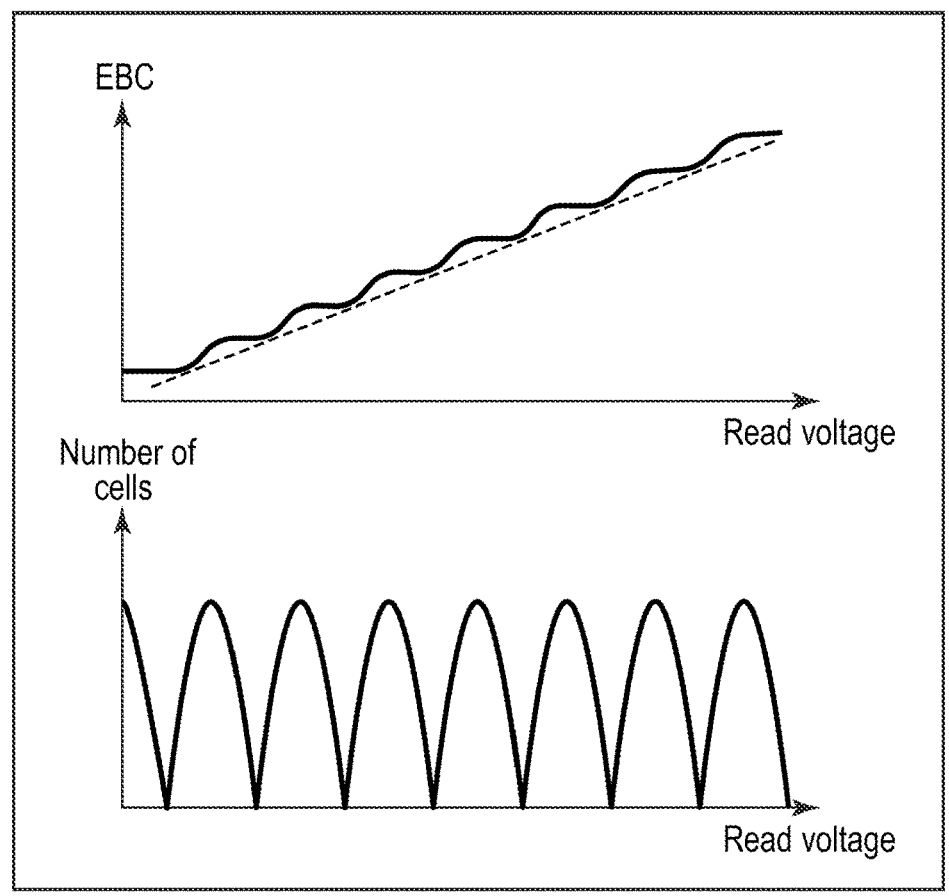
FIG. 17 illustrates another example of how to acquire the second correction value of the first embodiment.
FIG. 18 illustrates another example of how to acquire the second correction value of the first embodiment.

FIGS. 17 and 18 illustrate a third example of how to calculate the second correction value. In the upper graph of FIG. 17, the horizontal axis indicates the read voltage and the vertical axis indicates the EBC (solid line). The vertical axis and the horizontal axis are both linear scales. The lower graph of FIG. 17 corresponds to the threshold voltage distributions of the memory cells shown in FIGS. 4 and 15.

In this example, if the EBC is less than the OBC, the second correction value is set to −N (dac) to decrease the read voltage. In this method, a table storing a default correction value per read voltage is prepared separately. The optimal voltage value of each read voltage is calculated as the dac value. The correction value is an offset voltage value from the default read voltage value of each of the read voltages. If one correction value is 1 dac, the default correction value is used in conversion to calculate the correction value.

In the first to third example, the second correction value is calculated per read voltage. Thus, the OBC is calculated per read voltage in the read operation. However, in a fourth example, second correction values for at least two read voltages are calculated by any method of the first to third examples instead of calculating the second correction value per read voltage. The second correction values for other read voltages are estimated based on the calculated second correction values. Thus, the OBC is not necessary as to all the read voltages in the read operation. Since the load of calculation of the OBC is reduced, an operation to calculate the OBC causes less effect on the delay of response to the read command.

For example, in FIG. 18, the second correction values are calculated as to the read voltage VA and the read voltage VG. That is, the OBC is calculated as to the read voltage VA and the read voltage VG alone in the read operation, and the OBC is not calculated as to the read voltages other than the read voltage VA and the read voltage VG.

In the upper graph of FIG. 17, a straight line (broken line) connecting the EBC as to the read voltage VA and the EBC as to the read voltage VG is represented by a formula: y=ax+b, where y is the EBC and x is the read voltage to which the second correction value is added. The EBC (=y) as to the read voltages VA and VG and the read voltage (=x) are put into the formula representing the straight line to calculate "a" and "b". Then, the EBC as to other read voltages are put into the formula to calculate an estimated value of the second correction value.

Note that calculating the second correction values as to at least two read voltages may not be necessary, and calculating a second correction value as to one read voltage (for example, read voltage VG) may be sufficient. In that case, in the upper graph of FIG. 17, an estimated value of the second correction value can be calculated by putting the EBC as to other read voltage into a formula representing a straight line connecting the EBC as to the read voltage VG and the origin (point where both the read voltage and the EBC are zero).

As explained above, according to the first embodiment, the EBC is calculated in the write operation and is written to the NAND memory 5. In the read operation, the OBC is calculated from the read data, and calculated the OBC and the EBC read from the NAND memory 5 are compared. If they do not match, a correction value to optimize the read voltage is calculated. The read voltage in the first read operation with respect to the next read command to the same physical address in the NAND memory 5 is corrected based on the correction value. Thus, a possibility that the read voltage in the first read operation becomes optimal is increased, and a possibility that the number of retry reads is decreased becomes higher, and thus, decrease in response with respect to the read command can be prevented.

SECOND EMBODIMENT

In the first embodiment, as shown in FIG. 14, the EBC is included in the first L1 code frame and is written to the NAND memory 5. Now, a second embodiment in which the EBC is not included in the first L1 code frame and is written to the NAND memory 5 separated from the first L1 code frame will be explained. A system structure of the second embodiment is the same as that of the first embodiment.

An example of write operation and read operation in the second embodiment will be explained. FIG. 19 is a flowchart of an example of the write operation. The read operation and the write operation of the second embodiment are different from those of the first embodiment.

The controller 4 receives a write command from the host 2 in S302 of FIG. 19. The controller 4 randomizes write data corresponding to the write command in S304. The controller 4 adds a first L1 code per a particular size (may be referred to as a frame) of the randomized data, and encodes the write data in S306. Note that the encoding operation of S306 requires every write data in a write unit. Since the TLC memory cell is used in this example, the encoding operation is executed when three page write data is received.

The controller 4 calculates the $EBC_A$ to the $EBC_G$ of read voltages VA to VG from the randomized data encoded by the first L1 code, in S308. The EBC is calculated as in the example of the first embodiment explained with reference to FIGS. 7 and 8.

The controller 4 adds a second error correction code (a second L1 code) to the EBC to encode the EBC in S312. Error correction performance of the second L1 code may be set higher than that of the first L1 code. Although different error correction codes are used for encoding of the write data and the EBC, both the write data and the EBC may be encoded using the same error correction code (for example, the first L1 code).

The controller 4 writes, in S316, the randomized data encoded by the first L1 code, and the randomized EBC encoded by the second code to the NAND memory 5 in S316. As above, the EBC is written to the NAND memory 5 separated from the write data. Write destination of the EBC is the same as that of the first embodiment explained with reference to FIG. 9.

Figure 20:
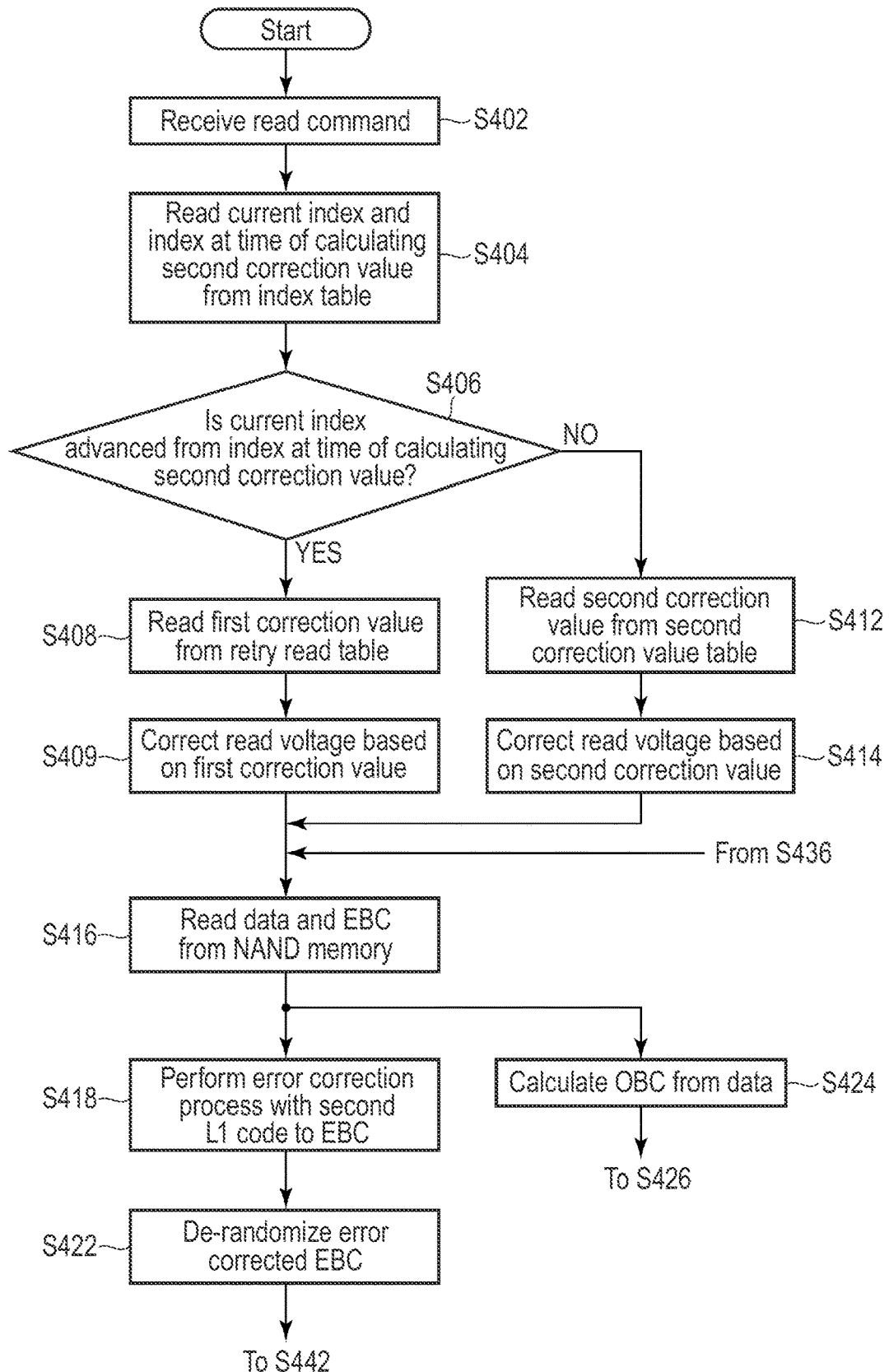
FIG. 20 is a flowchart of a part of an example of a read operation of the second embodiment.
Figure 21:
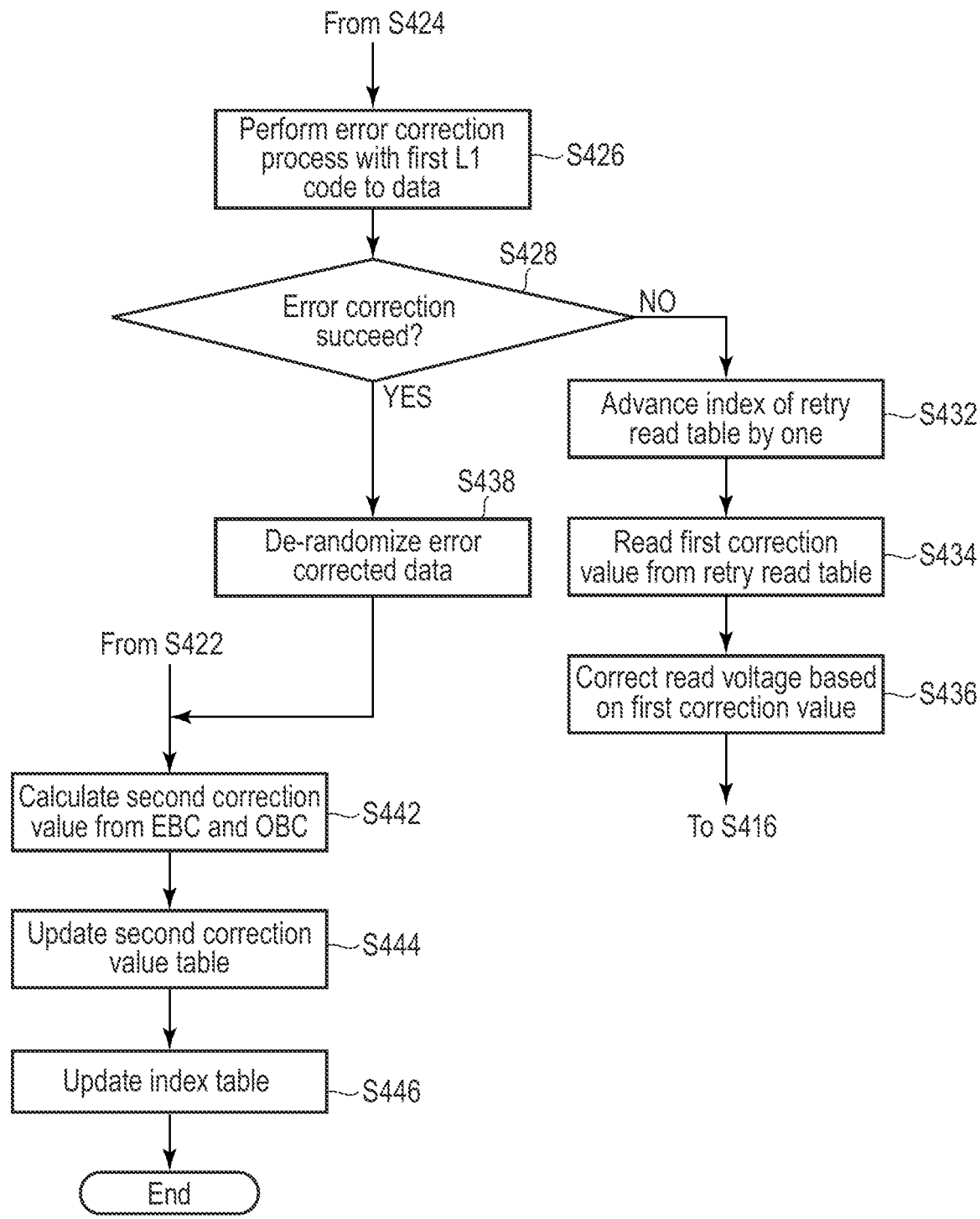
FIG. 21 is a flowchart of other part of the example of the read operation of the second embodiment.

FIGS. 20 and 21 illustrate a flowchart of an example of the read operation. S402 to S414 of FIG. 20 are the same as S202 to S214 of FIG. 10, and thus, explanation thereof will be omitted.

The controller 4 reads data and the EBC from the NAND memory 5 in S416 after completion of S409 which is the same as S209 of FIG. 10 or S414 which is the same as S214 of FIG. 10. The read voltage in the reading is the read voltage corrected in S409 or S414.

When data per write unit, that is, three page data in this example of the TLC memory cell is read, the controller 4 executes the error correction operation using the second L1 code with respect to the EBC and decodes the EBC in S418. When the error correction performance of the second L1 code is higher than that of the first L1 code, the error correction of the EBC does not fail easily. Note that the controller 4 de-randomizes the error corrected EBC in S422.

When the data per write unit is read in S416, the controller 4 calculates the $OBC_A$ to $OBC_G$ corresponding to the read voltages VA to VG from the data. The OBC is calculated as in the first embodiment. The controller 4 executes the error correction operation using the first L1 code with respect to the data in S426 of FIG. 21 and obtains the data. The controller 4 determines whether or not the error correction succeeds in S428.

If the error correction fails (NO in S428), the controller 4 advances the current index by one, and increments the current index in the index table 24 by one to update the index table 24 in S432. Note that, as in the first embodiment, the index may be incremented by one per several retry read operations instead of one retry read operation.

The controller 4 reads the first correction value of the current index from the retry read table 22 in S434. The controller 4 corrects the read voltages VA to VG based on the first correction value in S436. Specifically, the controller 4 adds the first correction value to the current value of the read voltage and corrects the read voltage.

Then, the controller 4 executes the retry read operation. That is, the controller 4 reads data and the EBC from the NAND memory 5 in S416. The read voltage in the read operation is the read voltage corrected in S436.

If the error correction succeeds (YES in S428), the controller 4 de-randomizes the error corrected data in S438.

The controller 4 calculates a second correction value for each of the read voltages VA to VG from the EBC and the OBC in S442 after completion of S422 or S438. The second correction value is calculated as in the first embodiment explained with reference to FIGS. 15 to 18.

The controller 4 writes the second correction value to the second correction value table 26 to update the second correction value table 26 in S444. The controller 4 rewrites the current index with the index at the time of calculating the second correction value of the index table 24 to update the index table 24.

Figure 22:
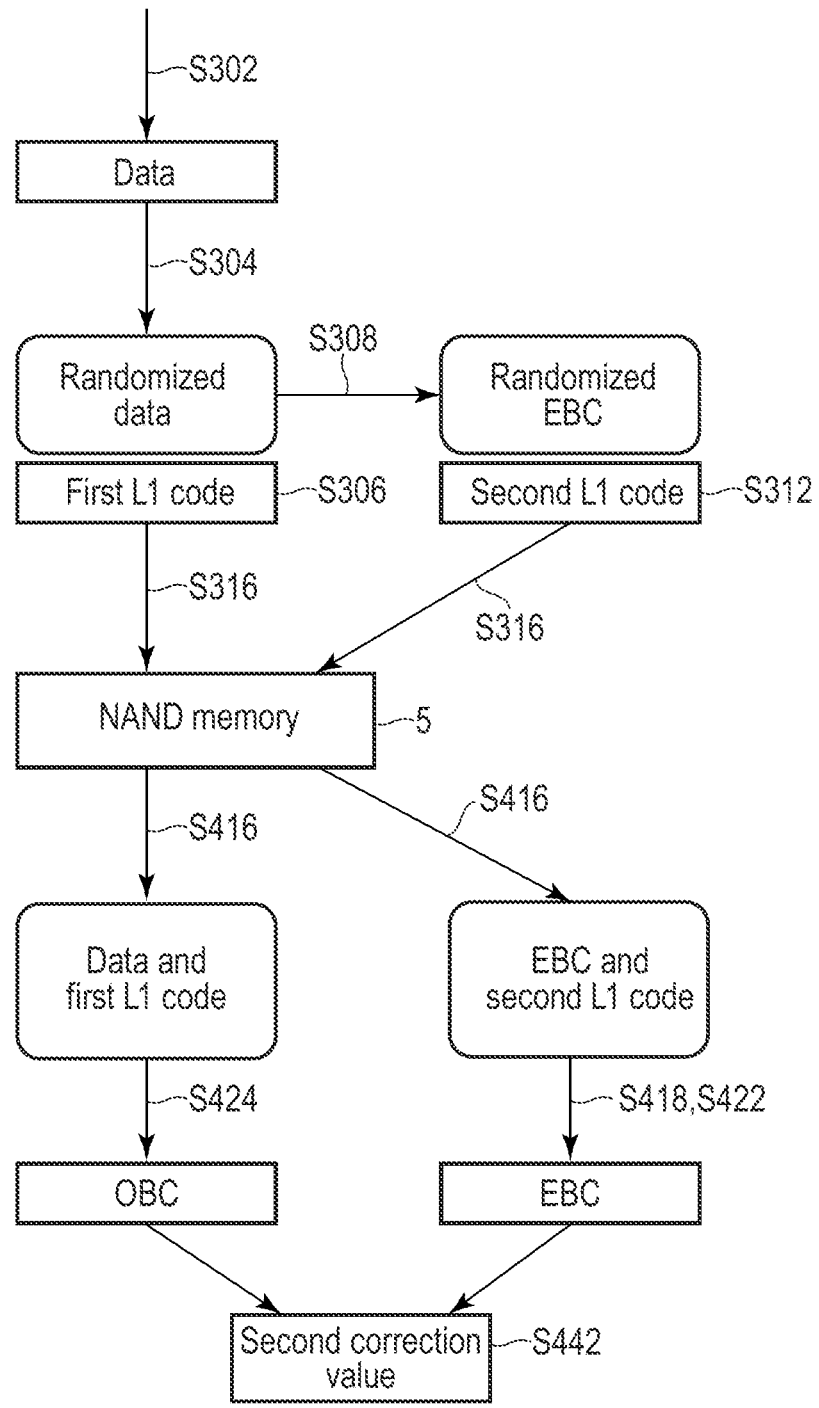
FIG. 22 is a schematic view of an example of the write operation and the read operation of the second embodiment.

FIG. 22 illustrates an outline of an example of the read operation of FIG. 19 and the write operation of FIGS. 20 and 21. FIG. 19 illustrates the write operation and the read operation of the second embodiment by showing the transitions of data. In FIG. 19, round-corner data indicates randomized data. Reference numbers added to arrows indicate reference numbers of operations in FIGS. 19 to 21. In the second embodiment, in the write operation, the EBC is calculated from the randomized data encoded by the first L1 code. The EBC is encoded by the second L1 code. The randomized data encoded by the second L1 code and the randomized EBC encoded by the second L1 code are written to the NAND memory 5. Furthermore, in the read operation, the encoded data and the encoded EBC are read, the OBC is calculated from the encoded data, and the EBC is calculated from the encoded EBC.

In the second embodiment, as in the first embodiment, the read voltage in the first read operation with respect to the read command is corrected based on a difference between the EBC and the OBC. Thus, a possibility that the number of retry read operations is decreased becomes higher, and thus, decrease in response with respect to the read command can be prevented.

THIRD EMBODIMENT

In the first and the second embodiments, the EBC is calculated in the write operation, and the EBC is written in the NAND memory 5. The EBC is read from the NAND memory 5 in the read operation, and is compared to the OBC calculated from the data read from the NAND memory 5. Based on a result of comparison, the second correction value is calculated.

Now, a third embodiment in which the EBC is written to the NAND memory 5 in the write operation while the second correction value is calculated in an idle time of the storage device instead of the read operation will be explained. A system structure of the third embodiment is the same as that of the first embodiment. The write operation of the third embodiment is the same as that of the first or second embodiment.

FIG. 23 is a flowchart of the processes executed by the controller 4 in an idle time. The controller 4 detects an idle time in S502. For example, it is determined an idle time if an I/O command such as the write command and read the command from the host 2 is not received for a particular time. If the idle time is detected, the controller 4 reads the EBCs of read voltages VA to VG from the NAND memory 5 in S504.

The controller 4 executes a single state read (SSR) operation with respect to read voltages VA to VG, and calculates the OBCs of read voltages VA to VG, in S506. When the SSR operation is executed with a single read voltage, a bit number in the read voltage is obtained, and thus, the OBC is calculated from the bit number. There may be a case where the EBCs of all read voltages are stored, and a case where only the EBC of a particular read voltage is stored. In the latter case, by executing the SSR operation of the particular read voltage, the OBC of the same read voltage as the EBC can be calculated without reading data of all pages per write.

The controller 4 calculates the second correction value from the EBC and the OBC in S508. The second correction value is calculated as in the first embodiment explained with reference to FIGS. 15 to 18.

The controller 4 updates the second correction value table 26 in S512.

The controller 4 updates the index table 24 in S514.

Figure 24:
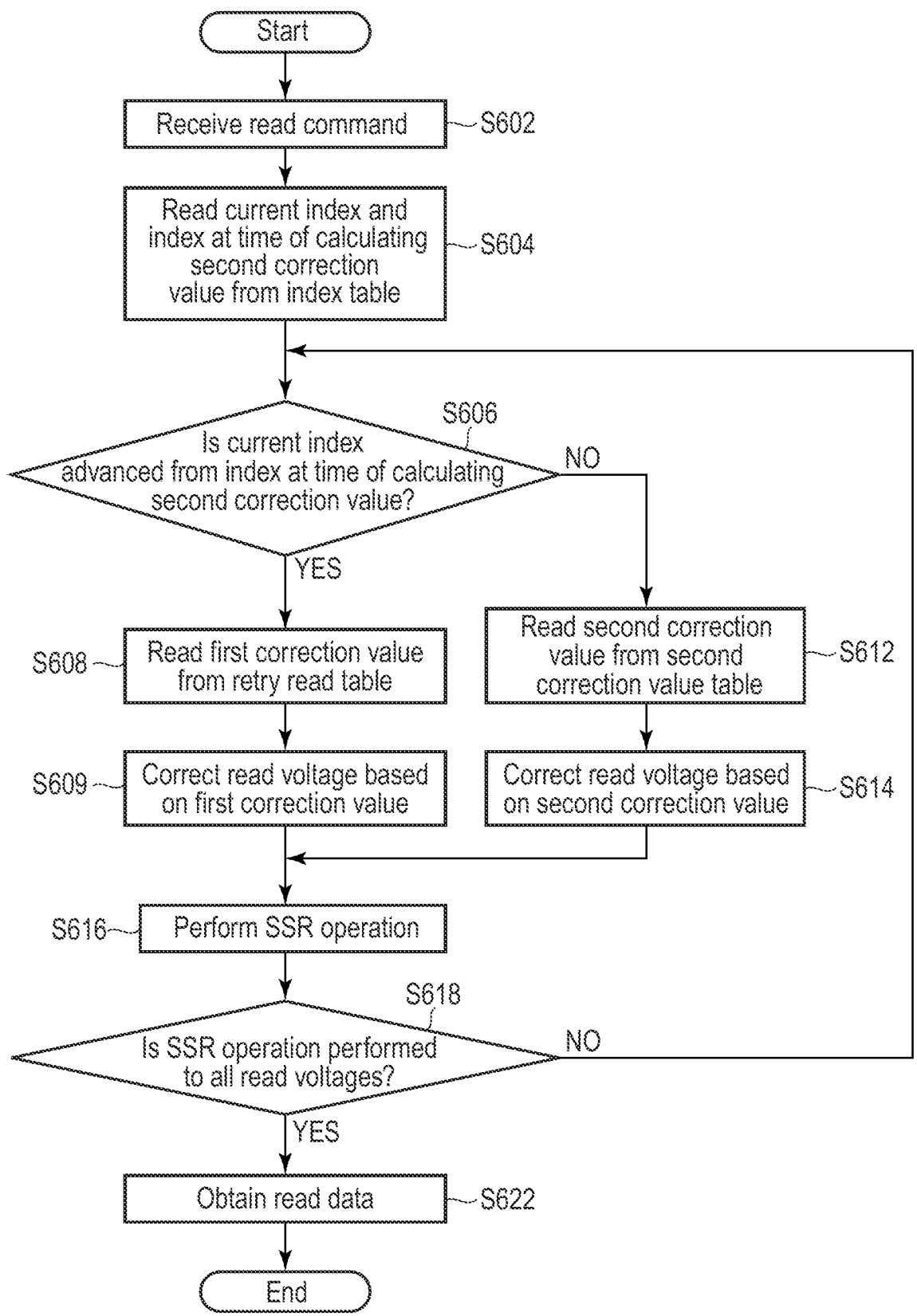
FIG. 24 is a flowchart of an example of a read operation of the third embodiment.

FIG. 24 is a flowchart of an example of read operation of the third embodiment. S602 to S614 of FIG. 24 are the same as S202 to S214 of FIG. 10 and S402 to S414 of FIG. 20, and thus, explanation thereof is omitted.

When S609 or S614 is completed, the controller 4 executes, in S616, the SSR operation of a particular read voltage and obtains a bit number. In the SSR operation, a bit number read with the particular voltage is obtained. The bit number is the same as one of the $OBC_A$ to $OBC_G$ of read voltages VA to VG.

The controller 4 determines whether or not the SSR operation is executed with respect to all the read voltages in S618.

If there is a read voltage to which the SSR operation has not been executed (NO in S618), the controller 4 repeats S606 to S618.

If the SSR operation is executed with respect to all the read voltages (YES in S618), the controller 4 executes a data processing of the bit numbers obtained by the SSR operation and obtains the write data obtained in a normal page read operation in S622.

Figure 25A:
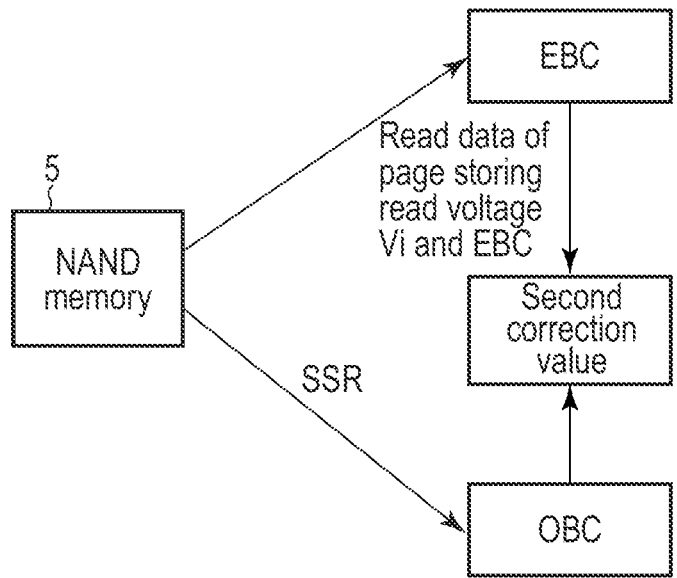
FIGS. 25A and 25B are schematic views of an example of the write operation and the read operation of the third embodiment.

FIG. 25A illustrates an outline of an example of the operation in the idle time shown in FIG. 23. A page storing the EBC of each of the read voltages VA to VG is read from the NAND memory 5. On the other hand, the SSR operation is executed in each of the read voltages VA to VG, and the OBC of each of the read voltages VA to VG is calculated. The second correction value is calculated based on a result of comparison of the EBC and the OBC.

Figure 25B:
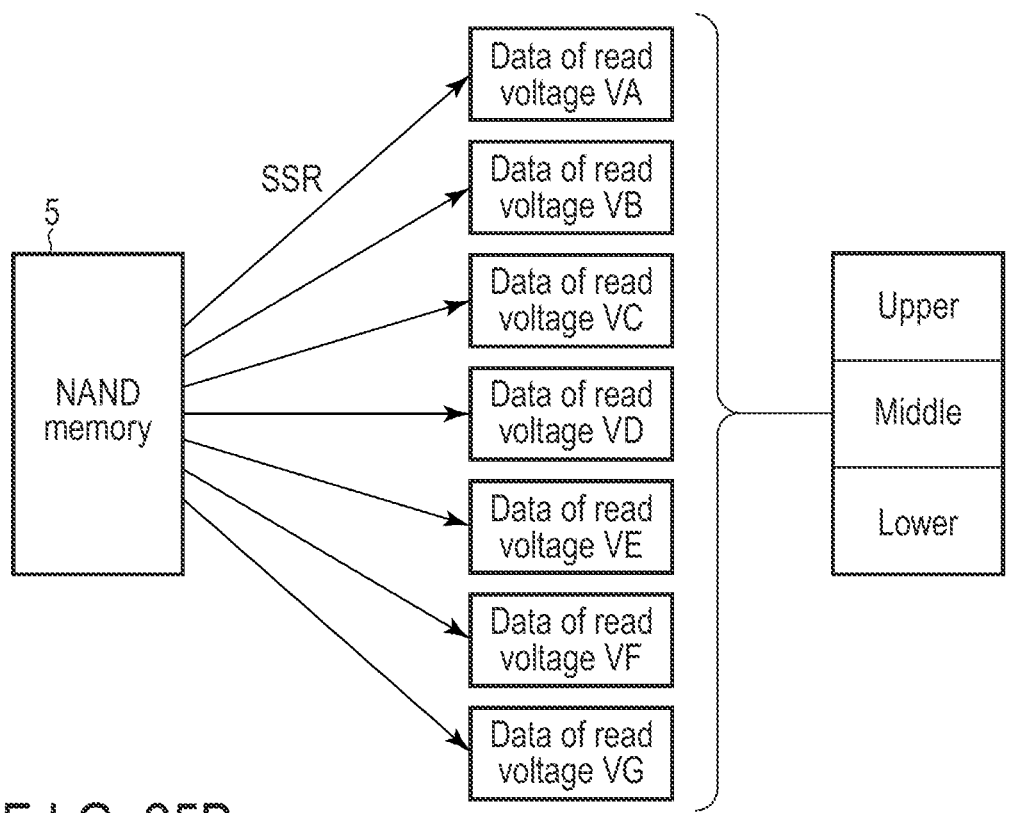

FIG. 25B illustrates an outline of an example of the read operation of FIG. 24. The SSR operation is executed to each of the read voltages VA to VG to which the second correction values are added, and the bit numbers same as the $OBC_A$ to $OBC_G$ of the read voltages VA to VG are obtained. The data is read by data-processing the bit numbers. Based on the data read by the read voltages VA to VG, the lower page, the middle page, and the upper page are formed.

According to the third embodiment, SSR is executed using the read voltages corrected as to each of the read voltages VA to VG, and the data of each page are obtained from the read data by the SSR, and thus, the read voltages VA to VG can be corrected more finely as compared to a case of the page read.

FOURTH EMBODIMENT

In the aforementioned embodiments, the EBC is written in the NAND memory 5. Now, a fourth embodiment in which the EBC is not written to the NAND memory 5 will be explained. A system structure of the fourth embodiment is the same as the system structure of the first embodiment.

FIG. 26 illustrates an example of write operation. The controller 4 receives the write command from the host 2 in S702. The controller 4 randomizes the write data corresponding to the write command in S704. Note that the randomization operation of S704 requires every write data in a write unit. Since the TLC memory cell is used in this example, the randomization operation is executed when three page write data is received.

The controller 4 adds, in S706, an error correction code (for example, the first L1 code) to every a particular size (may be referred to as a frame) to the randomized data to execute encode.

The controller 4 writes, in S708, the randomized data with the error correction code to the NAND memory 5.

Figure 27:
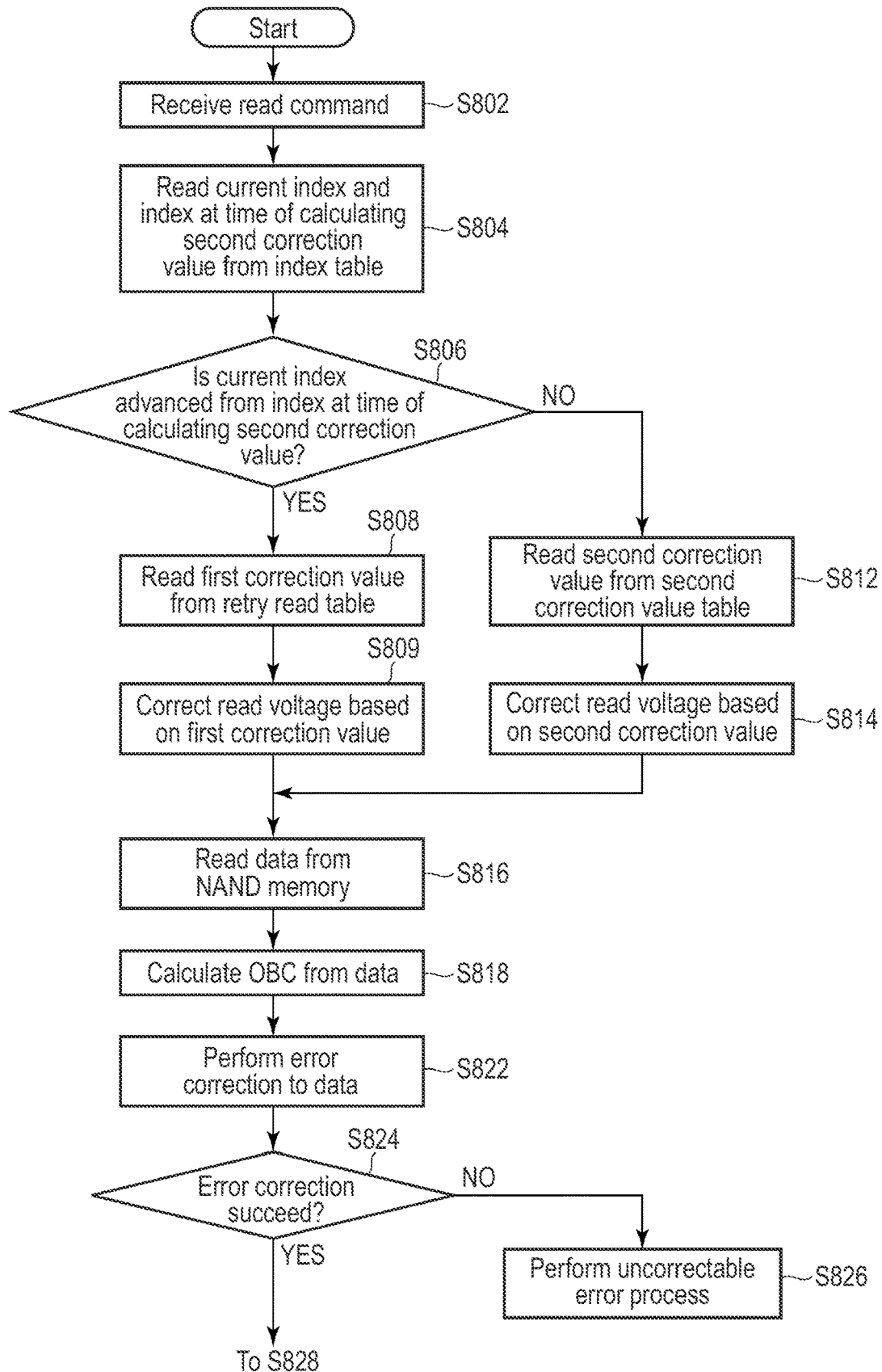
FIG. 27 is a flowchart of a part of an example of a read operation of the fourth embodiment.
Figure 28:
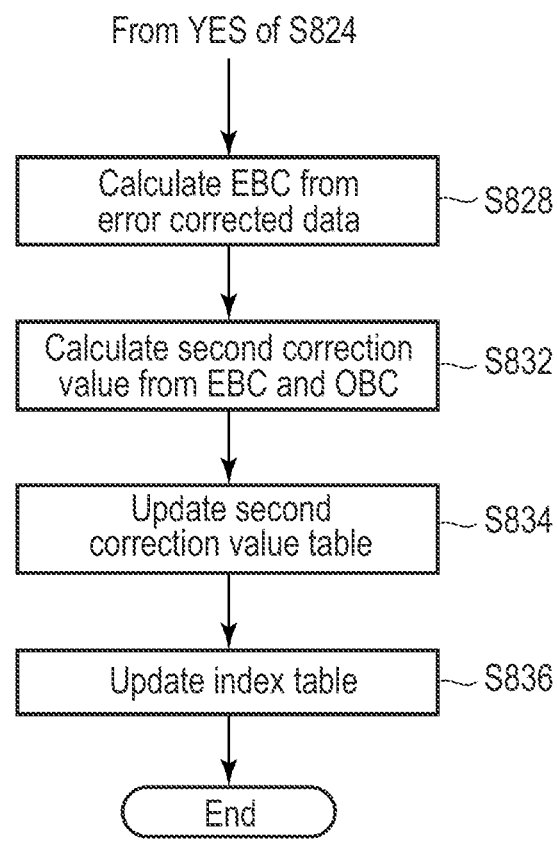
FIG. 28 is a flowchart of other part of the example of the read operation of the fourth embodiment.

FIGS. 27 and 28 illustrate flowcharts of an example of read operation of the fourth embodiment. S802 to S814 of FIG. 27 are the same as S202 to S214 of FIG. 10, S402 to S414 of FIG. 20, and S602 to S614 of FIG. 24, and thus, explanation thereof is omitted.

The controller 4 reads, in S816, data from the NAND memory 5 after completion of a process of S809 or S814. The read voltage is the read voltage corrected in S809 or S814.

When data per write unit, that is, three page write data in this example where the TLC memory cell is used is read, the controller 4 calculates the OBC from the read data in S818. The OBC is calculated as in the first embodiment. At this step, the error correction of the read data is not executed, and the bit number calculated from the data is the OBC.

The controller 4 executes, in S822, the error correction to the data read in S816, and obtains the write data.

The controller 4 determines whether or not the error correction succeeds in S824.

If the error correction fails (NO in S824), the controller 4 executes an uncorrectable error process in S826, and ends the read operation.

If the error correction succeeds (YES in S824), the controller 4 calculates the EBC from the error corrected data, that is, the obtained write data in S828 of FIG. 28. The EBC is calculated as in the calculation in the write operation of the first embodiment. At this step, since the error correction of the read data is successful, the bit number calculated from the data is the EBC.

The controller 4 calculates the second correction value for each of the read voltages VA to VG from the EBC and the OBC in S832. The controller 4 writes the second correction value to the second correction value table 26 and updates the second correction value table 26 in S834. The controller 4 rewrites the current index with the index at the time of calculating the second correction value in the index table 24 to update the index table 24 in S836.

According to the fourth embodiment, the EBC is calculated from the data by which the error correction is executed successfully in the read operation, and thus, writing of the EBC to the NAND memory 5 in the write operation can be omitted. Thus, the user data to be stored in the NAND memory 5 is not reduced by the EBC.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a nonvolatile memory; and
a controller configured to:
read data from the nonvolatile memory by applying a read voltage to the nonvolatile memory;
correct the read voltage based on a difference between a measured value of a bit number obtained when the data is read from the nonvolatile memory by applying the read voltage to the nonvolatile memory and an expected value of the bit number, the expected value being a value expected to be obtained when the data is read from the nonvolatile memory by applying the read voltage to the nonvolatile memory;
execute an error correction of the data read from the nonvolatile memory;
execute a retry read operation while changing the read voltage by a first correction value when the error correction fails; and
calculate a second correction value based on a difference between the expected value and the measured value when the error correction succeeds.

2. The storage device of claim 1, wherein
the controller is configured to execute, when a setting value of a read voltage in a read operation in response to a read command is equal to a setting value of a read voltage when the second correction value is obtained, a read operation by correcting the read voltage based on the second correction value.

3. The storage device of claim 1, wherein the controller is configured to:
calculate the expected value and to write the expected value to an unused part or a spare column of the nonvolatile memory; and
in a read operation or an idle time, calculate the measured value from a result of reading from the nonvolatile memory, and calculate the second correction value based on a difference between the expected value read from the nonvolatile memory and the measured value.

4. The storage device of claim 1, wherein the controller is configured to:
calculate the measured value from the data read from the nonvolatile memory;
calculate the expected value from error-corrected data of the data read from the nonvolatile memory; and
calculate the second correction value based on a difference between the measured value and the expected value.

5. The storage device of claim 1, wherein
the controller is configured to write multibit data per memory cell in the nonvolatile memory,
the read voltage includes a plurality of voltages to determine the multibit data, and
the controller is configured to calculate a second correction value for each of the voltages.

6. The storage device of claim 1, wherein
the controller is configured to write multibit data per memory cell in the nonvolatile memory,
the read voltage includes a plurality of voltages to determine the multibit data, and
the controller is configured to calculate second correction values for first and second voltages among the plurality of voltages, and estimate a second correction value of another voltage among the plurality of voltages other than the first and second voltages based on the second correction values of the first and second voltages.

7. The storage device of claim 1, wherein
the controller is configured to decrease the read voltage by a voltage when the measured value is larger than the expected value.

8. The storage device of claim 1, wherein
the controller is configured to decrease the read voltage by a voltage corresponding to a difference between the measured value and the expected value when the measured value is larger than the expected value.

9. The storage device of claim 1, wherein
the nonvolatile memory includes a NAND flash memory.

10. A reading method of a nonvolatile memory, comprising:
calculating an expected value of a bit number which is expected to obtained when data is read from the nonvolatile memory by applying a read voltage to the nonvolatile memory;
calculating a measured value of the bit number obtained when the data is read from the nonvolatile memory by applying the read voltage to the nonvolatile memory;
correcting the read voltage based on a difference between the expected value and the measured value;
executing an error correction of the data read from the nonvolatile memory;
executing a retry read operation while changing the read voltage by a first correction value when the error correction fails; and
calculating a second correction value based on a difference between the expected value and the measured value when the error correction succeeds.

11. The reading method of claim 10, further comprising:
executing, when a setting value of a read voltage in a read operation in response to a read command is equal to a setting value of a read voltage when the second correction value is obtained, a read operation by correcting the read voltage based on the second correction value.

12. The reading method of claim 10, further comprising:
calculating the expected value;
writing the expected value to an unused part or a spare column of the nonvolatile memory; and
in a read operation or an idle time, calculating the measured value from a result of reading from the nonvolatile memory, and calculating the second correction value based on a difference between the expected value read from the nonvolatile memory and the measured value.

13. The reading method of claim 10, further comprising:
calculating the measured value from the data read from the nonvolatile memory;
calculating the expected value from error-corrected data of the data read from the nonvolatile memory; and
calculating the second correction value based on a difference between the measured value and the expected value.

14. The reading method of claim 10, wherein the read voltage includes a plurality of voltages to determine multibit data, the method further comprising:
writing the multibit data per memory cell in the nonvolatile memory; and
calculating a second correction value for each of the voltages.

15. The reading method of claim 10, wherein the read voltage includes a plurality of voltages to determine multibit data, the method further comprising:
writing the multibit data per memory cell in the nonvolatile memory;
calculating second correction values for first and second voltages among the plurality of voltages; and
estimating a second correction value of another voltage among the plurality of voltages other than the first and second voltages based on the second correction values of the first and second voltages.

16. The reading method of claim 10, further comprising:
decreasing the read voltage by a voltage when the measured value is larger than the expected value.

17. The reading method of claim 10, further comprising:
decreasing the read voltage by a voltage corresponding to a difference between the measured value and the expected value when the measured value is larger than the expected value.

18. The reading method of claim 10, wherein
the nonvolatile memory includes a NAND flash memory.

* * * * *